US012645017B2

(12) United States Patent
Chong et al.

(10) Patent No.: US 12,645,017 B2
(45) Date of Patent: Jun. 2, 2026

(54) TRANSMISSIVE DIFFRACTION GRATING

(71) Applicant: ASML Netherlands B.V., Veldhoven (NL)

(72) Inventors: Derick Yun Chek Chong, 'S Hertogenbosch (NL); Wouter Joep Engelen, Eindhoven (NL); Vyacheslav Kachkanov, Steensel (NL); Vahid Mohammadi, Eindhoven (NL); Pieter Cristiaan De Groot, Heeze (NL)

(73) Assignee: ASML NETHERLANDS B.V., Veldhoven (NL)

( * ) Notice: Subject to any disclaimer, the term of this patent is extended or adjusted under 35 U.S.C. 154(b) by 675 days.

(21) Appl. No.: 18/003,301

(22) PCT Filed: Jun. 17, 2021

(86) PCT No.: PCT/EP2021/066365
§ 371 (c)(1),
(2) Date: Dec. 23, 2022

(87) PCT Pub. No.: WO2021/259745
PCT Pub. Date: Dec. 30, 2021

(65) Prior Publication Data
US 2023/0251407 A1 Aug. 10, 2023

(30) Foreign Application Priority Data
Jun. 24, 2020 (EP) ..................................... 20181998

(51) Int. Cl.
*G02B 5/18* (2006.01)
*G01M 11/02* (2006.01)
(Continued)

(52) U.S. Cl.
CPC ....... *G02B 5/1866* (2013.01); *G01M 11/0242* (2013.01); *G02B 5/1838* (2013.01);
(Continued)

(58) Field of Classification Search
None
See application file for complete search history.

(56) References Cited

U.S. PATENT DOCUMENTS 9,494,483 B2 11/2016 Frese et al.
2005/0221238 A1 10/2005 Dierichs
(Continued)

FOREIGN PATENT DOCUMENTS

CN 103307997 A 9/2013
DE 102012204704 A1 9/2013
(Continued)

OTHER PUBLICATIONS

International Search Report and Written Opinion of the International Searching Authority directed to International Patent Application No. PCT/EP2021/066365, mailed Sep. 2, 2021; 14 pages.
(Continued)

*Primary Examiner* — Derek S. Chapel
(74) *Attorney, Agent, or Firm* — Pillsbury Winthrop Shaw Pittman, LLP

(57) ABSTRACT

A transmissive diffraction grating for a phase-stepping measurement system for determining an aberration map for a projection system comprises an absorbing layer. The diffraction grating is for use with radiation having a first wavelength (for example (EUV radiation). The absorbing layer is provided with a two-dimensional array of through-apertures. The absorbing layer is formed from a material which has a refractive index for the radiation having the first wavelength in the range 0.% to 1.04.

14 Claims, 12 Drawing Sheets

(51) Int. Cl.
  *G02B 27/42*    (2006.01)
  *G03F 7/00*    (2006.01)

(52) U.S. Cl.
  CPC ......... *G02B 5/1857* (2013.01); *G02B 27/425*
    (2013.01); *G03F 7/70158* (2013.01); *G03F*
    *7/706* (2013.01); *G03F 7/7085* (2013.01);
        *G02B 2207/107* (2013.01)

(56)        References Cited

U.S. PATENT DOCUMENTS

| | | | |
|---|---|---|---|
| 2005/0275841 A1* | 12/2005 | Heerens | G03F 9/7076 |
| | | | 356/400 |
| 2008/0030742 A1* | 2/2008 | Hill | G01M 11/0257 |
| | | | 359/629 |
| 2015/0009492 A1* | 1/2015 | Frese | G03F 7/706 |
| | | | 356/124 |
| 2016/0147138 A1* | 5/2016 | Shih | G03F 1/24 |
| | | | 430/5 |

FOREIGN PATENT DOCUMENTS

| | | |
|---|---|---|
| JP | 6191921 B2 | 9/2017 |
| TW | 201709277 A | 3/2017 |
| WO | WO 2019/149467 A1 | 8/2019 |

OTHER PUBLICATIONS

International Preliminary Report on Patentability directed to International Patent Application No. PCT/EP2021/066365, issued Dec. 13, 2022; 11 pages.

\* cited by examiner

100

110

104

102

112

114

120

100          100          100

104          104          104

122

102          102          102

TRANSMISSIVE DIFFRACTION GRATING

CROSS-REFERENCE TO RELATED APPLICATIONS

This application claims priority of EP application 20181998.4 which was filed on 24 Jun. 2020, and which is incorporated herein in its entirety by reference.

FIELD

The present invention relates to a transmissive diffraction grating for a phase-stepping measurement system for determining an aberration map for a projection system and to methods for designing such a two-transmissive diffraction grating. In particular, the present invention relates to a two-dimensional diffraction grating (i.e. a diffraction grating causing a two-dimensional diffraction pattern) for a shearing phase-stepping interferometric measurement system.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Radiation that has been patterned by the patterning device is focussed onto the substrate using a projection system. The projection system may introduce optical aberrations, which cause the image formed on the substrate to deviate from a desired image (for example a diffraction limited image of the patterning device).

It may be desirable to provide methods and apparatus for accurately determining such aberrations caused by a projection system such that these aberrations can be better controlled.

SUMMARY

According to a first aspect of the invention there is provided a transmissive diffraction grating for a phase-stepping measurement system for determining an aberration map for a projection system using radiation having a first wavelength, wherein the diffraction grating comprises: an absorbing layer provided with a two-dimensional array of through-apertures, wherein the absorbing layer is formed from a material which has a refractive index for the radiation having the first wavelength in the range 0.96 to 1.04.

A diffraction grating having a two-dimensional array of through-apertures may be referred to herein as a two-dimensional diffraction grating (i.e. the repeating pattern causing the diffraction is two-dimensional). It will be appreciated that any reference to a two-dimensional grating herein is intended to mean a diffraction grating having a two-dimensional repeating pattern, which results in a two-dimensional diffraction pattern (as opposed to a one-dimensional or three-dimensional pattern). The two-dimensional array of through-apertures may, for example, be a square array of through-apertures.

The radiation having the first wavelength may comprise EUV radiation. EUV radiation may have a wavelength within the range 4-20 nm, for example 6.7 nm or 13.5 nm.

Typically, this type of two-dimensional diffraction grating is formed from an absorbing layer that is supported by a support layer. The support layer is formed from a material that has good mechanical properties, e.g. tensile strength, which a typical EUV absorber layer (usually a metal) does not have. For this reason, in prior art transmissive diffraction gratings for use with EUV radiation the absorbing layer is always supported by an adjacent support layer having better mechanical properties. The absorbing layer is patterned with an array of apertures and forms a binary diffraction grating. For such a grating, the material from which the absorbing layer is formed is typically chosen so as to have a relatively high extinction coefficient.

For example, for a phase-stepping measurement system for determining an aberration map for an EUV projection system, one type of grating comprises a patterned absorbing layer formed from chromium (Cr), nickel (Ni) or cobalt (Co). This absorbing layer is, in turn, supported by a support layer, which may comprise SiN or $Si_3N_4$. The absorbing layers in such known arrangements comprise chromium, nickel or cobalt since these metals all have relatively high extinction coefficients for EUV radiation.

One example prior art grating comprises a patterned absorbing layer formed from chromium with a thickness of 125 nm and a support layer comprising $Si_3N_4$ with a thickness of 100 nm. The extinction coefficient for chromium is sufficiently high that when EUV radiation propagates through a 125 nm thickness of chromium it may be attenuated in intensity by a factor of the order of 0.01 (i.e. such that only ~1% of the EUV radiation propagates through the chromium. That is, the extinction coefficient is sufficiently high that at this thickness one would expect substantially all of the radiation is blocked by the absorbing layer (and it acts like a true binary grating).

However, the inventors of the present invention have realised that, in use, the radiation of the first wavelength will be incident on the two-dimensional grating at a range of angles. In particular, for high numerical aperture projections systems, the radiation may be incident at a large range of angles. Further, the inventors have realised that, as a result, at least some of the radiation that is incident on the absorbing layer (for example at a large angle of incidence and close to one of the through apertures) will propagate through a distance in the absorbing layer that is only a small fraction of the thickness of the absorbing layer and will therefore not be fully attenuated. The inventors have also realised that, in general, if there is a significant difference in refractive index between the absorbing layer and the surrounding medium (which will be in the through-apertures) then there will be a significant phase difference induced between the radiation that propagates through the absorbing layer and the radiation that does not (due to the different optical path lengths experienced). This causes some distortion of the wavefront of the incident radiation. In turn, this will give rise to interference effects which will affect the measurements made by the phase-stepping measurement system. The phase difference induced between the radiation that propagates through the absorbing layer and the radiation that does not is proportional to the thickness of the absorbing layer multiplied by the difference in refractive indices of the absorbing layer and the surrounding medium (which is in the apertures). Reducing the thickness of the absorbing layer will therefore reduce these phase differences. However, there is a lower limit on the thickness of the absorbing layer which will still have sufficiently favourable mechanical and thermal properties.

In general, the surrounding medium may be a low pressure gas, for example hydrogen or air, and will have a refractive index of approximately 1. Advantageously, since the absorbing layer is formed from a material which has a refractive index which is close to 1 for the radiation having the first wavelength (i.e. in the range 0.96 to 1.04 such that ln−11≤0.04) the two-dimensional transmissive diffraction grating will be less sensitive to such errors.

It will be appreciated that the absorbing layer may be configured so as to absorb more than 50% of radiation having a first wavelength incident thereon. The absorbing layer may be configured so as to absorb more than 60% of radiation having a first wavelength incident thereon. The absorbing layer may be configured so as to absorb more than 70% of radiation having a first wavelength incident thereon. The absorbing layer may be configured so as to absorb more than 80% of radiation having a first wavelength incident thereon. The absorbing layer may be configured so as to absorb more than 90% of radiation having a first wavelength incident thereon. It will be appreciated that the amount of radiation having a first wavelength incident on the absorbing material that is absorbed by the absorbing layer is dependent on the extinction coefficient of the absorbing layer for radiation having a first wavelength and a thickness of the absorbing layer.

The absorbing layer may comprise aluminium.

Advantageously, the refractive index of aluminium for EUV radiation is approximately 1 (such that it will not cause significant wavefront distortion due to a difference in refractive index between the absorbing layer and the surrounding medium). Furthermore, aluminium has an extinction coefficient for EUV radiation that is comparable to that of chromium (which is used as an absorbing layer in some existing gratings).

For embodiments wherein the absorbing layer only comprises aluminium, the grating may also comprise some additional mechanical support (for example a support layer).

According to a second aspect of the invention there is provided a transmissive diffraction grating for a phase-stepping measurement system for determining an aberration map for a projection system using radiation having a first wavelength, wherein the diffraction grating comprises: an absorbing layer provided with a two-dimensional array of through-apertures, wherein the absorbing layer comprises aluminium.

The absorbing layer may comprise a ceramic.

The ceramic may comprise a metal or metalloid component having a relatively high extinction coefficient for EUV radiation and a non-metal component. Both components may have a refractive index for EUV which is relatively close to 1. The ceramic may comprise aluminium nitride (AlN).

The absorbing layer may comprise aluminium nitride (AlN).

Aluminium nitride has a refractive index for EUV of approximately 0.98. Aluminium nitride has an extinction coefficient for EUV or approximately 0.03.

A membrane of the grating may have a thickness of less than 150 nm.

The membrane comprises the absorbing layer. Additionally, the membrane may also comprise a support layer adjacent the absorbing layer.

The absorbing layer may, for example, have a thickness of around 100 nm. Advantageously, this can reduce shadowing effects which are caused by increasing a thickness of the grating and phase retardation effects (which scale with the thickness of the membrane multiplied by the difference in refractive index between the membrane material and the surrounding medium). For these reasons, it is desirable to reduce the thickness of the absorbing layer as much as possible, whilst still providing sufficient absorption of the incident radiation and maintaining acceptable mechanical and thermal properties.

The dimensions of a membrane of the grating in a plane of the grating may be 10 μm or greater.

The dimensions of the membrane of the grating in the plane of the grating may, for example, be 25 μm×25 μm. Alternatively, the dimensions of the membrane of the grating in the plane of the grating may, for example, be 50 μm×50 μm. Alternatively, the dimensions of the membrane of the grating in the plane of the grating may, for example, be 140 μm×140 μm.

For an embodiment wherein the dimensions of the membrane of the grating in a plane of the grating are 10 μm or greater and the membrane of the grating has a thickness of less than 150 nm, an aspect ratio of the membrane of the grating (for example a ratio between dimensions of the membrane of the grating in a plane of the grating and the thickness of the membrane of the grating) may be of the order of 100 or greater.

A ratio of a dimension of the membrane of the grating in a plane of the grating to a thickness of the membrane of the absorbing layer may be of the order of 100 or greater.

In general, provided the absorbing layer is of sufficient thickness to provide adequate absorption of the EUV radiation, a smaller the thickness of the membrane is beneficial for the optical performance of the grating (for example reducing three dimensional effects) but may be challenging to achieve whilst maintaining acceptable mechanical and thermal properties. In order to maintain acceptable mechanical and thermal properties for these embodiments, the grating membrane may comprise a support layer adjacent to the absorbing layer.

The transmissive diffraction grating may further comprise a support for the absorbing layer. The support may only contact a peripheral portion of the absorbing layer. That is, the support may be of the form of a frame and the support does not comprise a support layer adjacent the absorbing layer. With such an arrangement, in a central portion of the absorbing layer, the absorbing layer may be considered to be self-supporting. To achieve this, the absorbing layer may be tensioned on the support (for example such that it remains generally planar).

Advantageously, for embodiments wherein the central portion of the absorbing layer is self-supporting, the grating does not need, for example, a transmissive supporting layer (either patterned or otherwise). This is particularly beneficial for use in a phase-stepping measurement system for determining an aberration map for a projection system that uses EUV radiation since the use of a transmissive supporting layer could significantly reduce the amount of EUV radiation that is transmitted by the two-dimensional diffraction grating (if not patterned) and can contribute to three dimensional effects (if patterned).

The absorbing layer may be tensioned on the support with a pretension of at least 25 MPa. A typical pretension may be in the range 25 MPa to a few hundred MPa, for example in the range 50 MPa to 100 MPa.

In order to achieve such an arrangement, the material from which the absorbing layer is formed should have sufficient strength. It will be appreciated that the tension applied to the absorbing layer will be concentrated around the edges of the through-apertures in the absorbing layer. For example, for circular apertures the tension around the edges of the through-apertures in the absorbing layer may be factor of 2.7 greater than the tension applied to the absorbing layer by the support. For other shaped apertures (for example square apertures) the tension around the edges of the through-apertures in the absorbing layer will be greater than the tension applied to the absorbing layer by the support by an even larger factor (particularly at the corners of the square apertures).

Therefore, in order to be sufficiently strong to withstand a pretension of at least 25 MPa, the material from which the absorbing layer is formed may have a tensile strength that is several times larger than this.

The material from which the absorbing layer is formed may have a tensile strength of at least 500 MPa. In some embodiments, the material from which the absorbing layer is formed may have a tensile strength of at least 1000 MPa.

In addition to a high tensile strength, the material from which the absorbing layer is formed may also have the following mechanical and thermal properties.

The material from which the absorbing layer is formed may be relatively stiff. For example, the material from which the absorbing layer is formed may have a sufficiently high Young's modulus such that stress within the absorbing layer does not cause significant distortion of the grating pattern. This stress may include pre-tension applied during manufacture of the grating and stress caused by thermal expansion in use due to the heat load from the incident radiation.

The material from which the absorbing layer is formed may have a Young's modulus of at least 70 GPa.

In some embodiments, the material from which the absorbing layer is formed may have a Young's modulus of at least 100 GPa. In some embodiments, the material from which the absorbing layer is formed may have a Young's modulus of at least 200 GPa. The material from which the absorbing layer is formed may have a relatively small coefficient of thermal expansion. This will reduce distortion and internal stress within the absorbing layer. For example, the material from which the absorbing layer is formed may have a coefficient of thermal expansion of less than $10^{-1}$ $K^{-5}$.

The material from which the absorbing layer is formed may have a relatively large thermal conductivity. This will help dissipate the heat load (for example to the support). For example, the material from which the absorbing layer is formed may have a thermal conductivity of at least 40 W/mK.

For example, the material from which the absorbing layer is formed may have a sufficiently high Young's modulus such that stress within the absorbing layer does not cause significant distortion of the grating pattern. This stress may include pre-tension applied during manufacture of the grating and stress caused by thermal expansion in use due to the heat load from the incident radiation.

The absorbing layer may be provided with a protective coating.

The protective coating may have a thickness of a few nm. For example, the protective coating may have a thickness of the order of 5-10 nm.

The protective coating may be formed from a material having suitable chemical properties so as to be stable in the environment of an EUV lithographic apparatus LA. In particular, the protective coating may be formed from any material that is more suitable for use in such an environment so as to enhance the lifetime performance of the absorbing layer. It may also be desirable for the material from which the protective coating is formed to have a relatively high extinction coefficient for EUV radiation (to enhance the absorption of the EUV radiation and a refractive index which is as close as possible to 1 (to reduce phase retardation effects).

For embodiments wherein the absorbing layer is provided with a protective coating, an effective refractive index of the absorbing layer and protective coating of the two-dimensional grating may have a refractive index which in the range 0.96 to 1.04. Here, it will be appreciated that the effective refractive index of a composite material may be defined as the refractive index the ratio of the speed of light in vacuum to the average speed of light in the composite material. It will be appreciated that this may be a weighted average of the refractive indices of the component materials, wherein the average is weighted by the thicknesses of the materials. For example, consider an embodiment comprising an absorbing layer with a thickness of 100 nm and a refractive index of 0.98 that is provided with a 10 nm coating of a material having a refractive index of 0.97. As (normally incident) light propagates through this composite system, it will travel through 20 nm of the coating material and 100 nm of the absorbing material. It will therefore experience an effective refractive index of (100*0.98+20*0.97)/ 120=0.978.

At least a portion of the incident radiation will only propagate through the protective coating (if incident proximate to one of the apertures of the grating at a suitable angle of incidence). Therefore, it may be preferred for the refractive index of both the absorbing layer and the protective coating to have a refractive index which is close to 1. For example, the absorbing layer and the protective coating may both be formed materials which have an effective refractive index which is close to 1 for the radiation having the first wavelength (i.e. in the range 0.96 to 1.04 such that $ln-1|{\geq}0.04$).

The absorbing layer may comprise aluminium oxide $(Al_2O_3)$.

According to a third aspect of the invention there is provided a method of designing a diffraction grating for a phase-stepping measurement system for determining an aberration map for a projection system, the method comprising: selecting a material for an absorbing layer of the grating such that the refractive index of the material for the radiation having a first wavelength is substantially matched to a transmissive medium that will, in use, be disposed within apertures in the absorbing layer.

The refractive indices of the absorbing layer and the transmissive medium may be considered to be matched if the difference in refractive indices of the absorbing layer and the transmissive medium is less than 0.04.

According to a fourth aspect of the invention there is provided a method of designing a diffraction grating for a phase-stepping measurement system for determining an aberration map for a projection system, the method comprising: selecting a material for an absorbing layer of the grating, such that the refractive index of the material for the radiation having the a wavelength is in the range 0.96 to 1.04.

The diffraction grating may have a two-dimensional array of through-apertures. A diffraction grating having a two-dimensional array of through-apertures may be referred to herein as a two-dimensional diffraction grating (i.e. the repeating pattern causing the diffraction is two-dimensional). The two-dimensional array of through-apertures may, for example, be a square array of through-apertures.

According to a fifth aspect of the invention there is provided a diffraction grating designed according to the method of the third aspect of the invention or the fourth aspect of the invention.

According to a sixth aspect of the invention there is provided a measurement system for determining an aberration map for a projection system, the measurement system comprising: a patterning device; an illumination system arranged to illuminate the patterning device with radiation, the patterning device comprising a first patterned region arranged to receive a radiation beam and to form a plurality of first diffraction beams, the first diffraction beams being separated in a shearing direction; a sensor apparatus comprising a second patterned region, the second patterned region comprising a diffraction grating according to any one of first, second or firth aspects of the invention, and a radiation detector; the projection system being configured to project the first diffraction beams onto the sensor apparatus, the second patterned region being arranged to receive the first diffraction beams from the projection system and to form a plurality of second diffraction beams from each of the first diffraction beams; a positioning apparatus configured to move at least one of the patterning device and the sensor apparatus in the shearing direction; and a controller configured to: control the positioning apparatus so as to move at least one of the first patterning device and the sensor apparatus in the shearing direction such that an intensity of radiation received by each part of the radiation detector varies as a function of the movement in the shearing direction so as to form an oscillating signal; determine from the radiation detector a phase of a harmonic of the oscillating signal at a plurality of positions on the radiation detector; and determine a set of coefficients that characterize the aberration map of the projection system from the phase of a harmonic of the oscillating signal at the plurality of positions on the radiation detector.

According to a seventh aspect of the invention there is provided a lithographic apparatus comprising the measurement system of the sixth aspect of the invention.

BRIEF DESCRIPTION OF THE DRAWINGS

Embodiments of the invention will now be described, by way of example only, with reference to the accompanying schematic drawings, in which.

DETAILED DESCRIPTION

Figure 1:
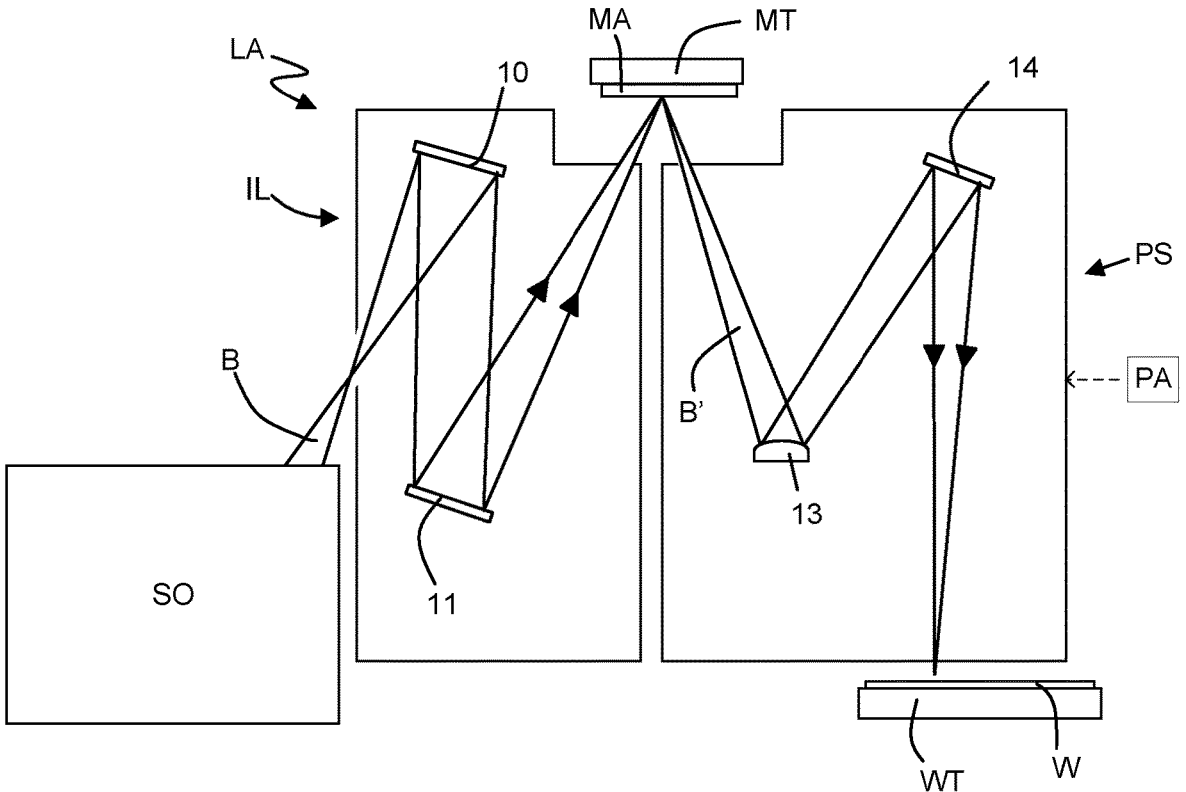
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a pattering device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the pattering device MA. As a result of this interaction a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B' thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

In general, the projection system PS has an optical transfer function which may be non-uniform, which can affect the pattern which is imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zemike polynomials are orthogonal on the unit circle, the Zernike coefficients may be obtained from a measured scalar map by calculating the inner product of the measured scalar map with each Zemike polynomial in turn and dividing this by the square of the norm of that Zemike polynomial. In the following, unless stated otherwise, any reference to Zemike coefficients will be understood to mean the Zernike coefficients of a relative phase map (also referred to herein as an aberration map). It will be appreciated that in alternative embodiments other sets of basis functions may be used. For example some embodiments may use Tatian Zemike polynomials, for example for obscured aperture systems.

The wavefront aberration map represents the distortions of the wavefront of light approaching a point in an image plane of the projection system PS from a spherical wavefront (as a function of position in the pupil plane or, alternatively, the angle at which radiation approaches the image plane of the projection system PS). As discussed, this wavefront aberration map $W(x,y)$ may be expressed as a linear combination of Zernike polynomials:

$$W(x, y) = \sum_n c_n \cdot Z_n(x, y) \qquad (1)$$

where x and y are coordinates in the pupil plane, $Z_n(x,y)$ is the nth Zernike polynomial and $c_n$ is a coefficient. It will be appreciated that in the following, Zemike polynomials and coefficients are labelled with an index which is commonly referred to as a Noll index. Therefore, $Z_n(x,y)$ is the Zernike polynomial having a Noll index of n and $c_n$ is a coefficient having a Noll index of n. The wavefront aberration map may then be characterized by the set of coefficients $c_n$ in such an expansion, which may be referred to as Zernike coefficients.

It will be appreciated that only a finite number of Zernike orders are taken into account. Different Zernike coefficients of the phase map may provide information about different forms of aberration which are caused by the projection system PS. The Zemike coefficient having a Noll index of 1 may be referred to as the first Zernike coefficient, the Zemike coefficient having a Noll index of 2 may be referred to as the second Zemike coefficient and so on.

The first Zemike coefficient relates to a mean value (which may be referred to as a piston) of a measured wavefront. The first Zemike coefficient may be irrelevant to the performance of the projection system PS and as such may not be determined using the methods described herein. The second Zernike coefficient relates to the tilt of a measured wavefront in the x-direction. The tilt of a wavefront in the x-direction is equivalent to a placement in the x-direction. The third Zernike coefficient relates to the tilt of a measured wavefront in the y-direction. The tilt of a wavefront in the y-direction is equivalent to a placement in the y-direction. The fourth Zernike coefficient relates to a defocus of a measured wavefront. The fourth Zernike coefficient is equivalent to a placement in the z-direction. Higher order Zemike coefficients relate to other forms of aberration which are caused by the projection system (e.g. astigmatism, coma, spherical aberrations and other effects).

Throughout this description the term "aberrations" should be intended to include all forms of deviation of a wavefront from a perfect spherical wavefront. That is, the term "aberrations" may relate to the placement of an image (e.g. the second, third and fourth Zernike coefficients) and/or to higher order aberrations such as those which relate to Zemike coefficients having a Noll index of 5 or more. Furthermore, any reference to an aberration map for a projection system may include all forms of deviation of a wavefront from a perfect spherical wavefront, including those due to image placement.

The transmission map and the relative phase map are field and system dependent. That is, in general, each projection system PS will have a different Zemike expansion for each field point (i.e. for each spatial location in its image plane).

As will be described in further detail below, the relative phase of the projection system PS in its pupil plane may be determined by projecting radiation from an object plane of the projection system PS (i.e. the plane of the patterning device MA), through the projection system PS and using a shearing interferometer to measure a wavefront (i.e. a locus of points with the same phase). The shearing interferometer may comprise a diffraction grating, for example a two dimensional diffraction grating, in an image plane of the projection system (i.e. the substrate table WT) and a detector arranged to detect an interference pattern in a plane that is conjugate to a pupil plane of the projection system PS.

The projection system PS comprises a plurality of optical elements (including mirrors 13, 14). As already explained, although the projection system PS is illustrated as having only two mirrors 13, 14 in FIG. 1, the projection system PS may include a different number of mirrors (e.g. six or eight mirrors). The lithographic apparatus LA further comprises adjusting means PA for adjusting these optical elements so as to correct for aberrations (any type of phase variation across the pupil plane throughout the field). To achieve this, the adjusting means PA may be operable to manipulate optical elements within the projection system PS in one or more different ways. The projection system may have a co-ordinate system wherein its optical axis extends in the z direction (it will be appreciated that the direction of this z axis changes along the optical path through the projection system, for example at each mirror or optical element). The adjusting means PA may be operable to do any combination of the following: displace one or more optical elements; tilt one or more optical elements; and/or deform one or more optical elements. Displacement of optical elements may be in any direction (x, y, z or a combination thereof). Tilting of optical elements is typically out of a plane perpendicular to the optical axis, by rotating about axes in the x or y directions although a rotation about the z axis may be used for non-rotationally symmetric optical elements. Deformation of an optical element may be performed for example by using actuators to exert force on sides of the optical element and/or by using heating elements to heat selected regions of the optical element. In general, it may not be possible to adjust the projection system PS to correct for apodizations (transmission variation across the pupil plane). The transmission map of a projection system PS may be used when designing masks MAs for the lithographic apparatus LA.

In some embodiments, the adjusting means PA may be operable to move the support structure MT and/or the substrate table WT. The adjusting means PA may be operable to displace (in any of the x, y, z directions or a combination thereof) and/or tilt (by rotating about axes in the x or y directions) the support structure MT and/or the substrate table WT.

A projection system PS which forms part of a lithographic apparatus may periodically undergo a calibration process. For example, when a lithographic apparatus is manufactured in a factory the optical elements (e.g. mirrors) which form the projection system PS may be set up by performing an initial calibration process. After installation of a lithographic apparatus at a site at which the lithographic apparatus is to be used, the projection system PS may once again be calibrated. Further calibrations of the projection system PS may be performed at regular intervals. For example, under normal use the projections system PS may be calibrated every few months (e.g. every three months).

Calibrating a projection system PS may comprise passing radiation through the projection system PS and measuring the resultant projected radiation. Measurements of the projected radiation may be used to determine aberrations in the projected radiation which are caused by the projection system PS. Aberrations which are caused by the projection system PS may be determined using a measurement system. In response to the determined aberrations, the optical elements which form the projection system PS may be adjusted so as to correct for the aberrations which are caused by the projection system PS.

Figure 2:
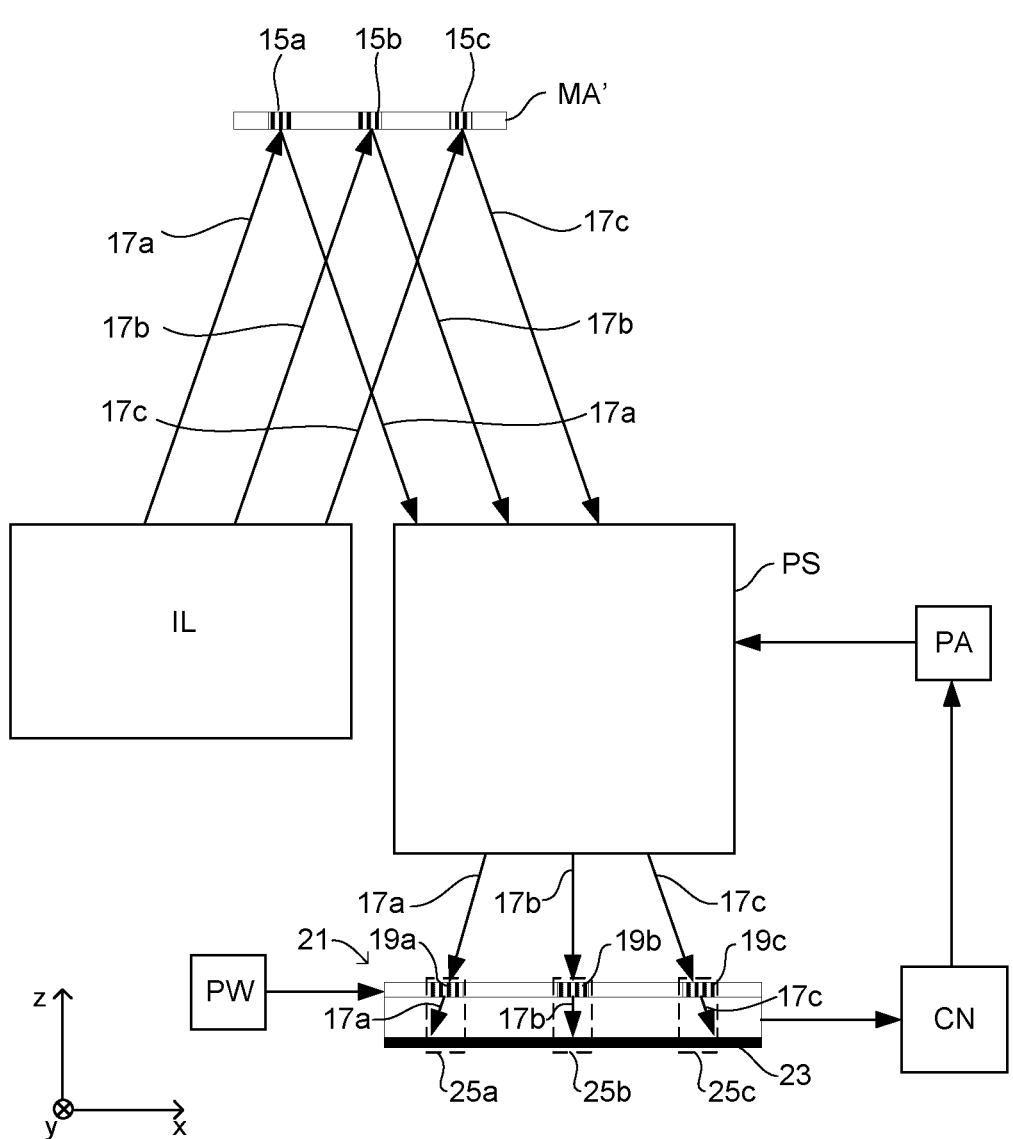
FIG. 2 is a schematic illustration of a measurement system according to an embodiment of the invention.

FIG. 2 is a schematic illustration of a measurement system 10 which may be used to determine aberrations which are caused by a projection system PS. The measurement system 10 comprises an illumination system IL, a measurement patterning device MA', a sensor apparatus 21 and a controller CN. The measurement system 10 may form part of a lithographic apparatus. For example, the illumination system IL and the projection system PS which are shown in FIG. 2 may be the illumination system IL and projection system PS of the lithographic apparatus which is shown in FIG. 1. For ease of illustration additional components of a lithographic apparatus are not shown in FIG. 2.

The measurement patterning device MA' is arranged to receive radiation from the illumination system IL. The sensor apparatus 21 is arranged to receive radiation from the projection system PS. During normal use of a lithographic apparatus, the measurement pattering device MA' and the sensor apparatus 21 which are shown in FIG. 2 may be located in positions that are different to the positions in which they are shown in FIG. 2. For example, during normal use of a lithographic apparatus a patterning device MA which is configured to form a pattern to be transferred to a substrate W may be positioned to receive radiation from the illumination system IL and a substrate W may be positioned to receive radiation from the projection system PS (as is shown, for example, in FIG. 1). The measurement patterning device MA' and the sensor apparatus 21 may be moved into the positions in which they are shown in FIG. 2 in order to determine aberrations which are caused by the projection system PS. The measurement patterning device MA' may be supported by a support structure MT, such as the support structure which is shown in FIG. 1. The sensor apparatus 21 may be supported by a substrate table, such as the substrate table WT which is shown in FIG. 1. Alternatively the sensor apparatus 21 may be supported by a measurement table (not shown) which may be separate to the sensor table WT.

Figure 3A:
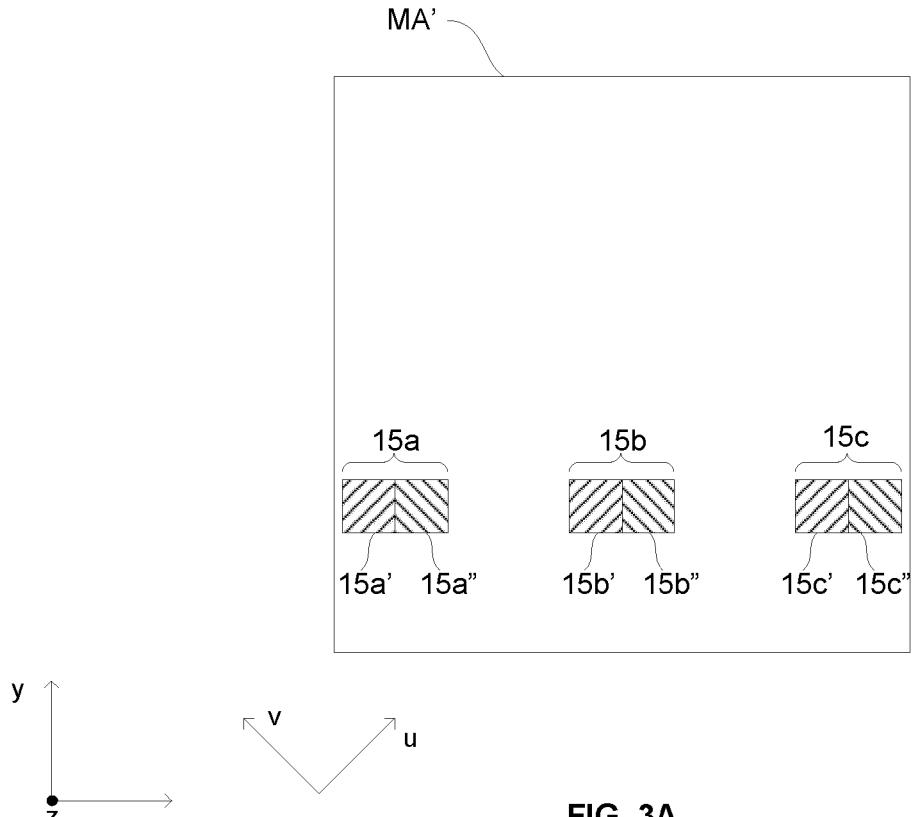
FIGS. 3A and 3B are schematic illustrations of a patterning device and a sensor apparatus which may form part of the measurement system of FIG. 2.
Figure 3B:
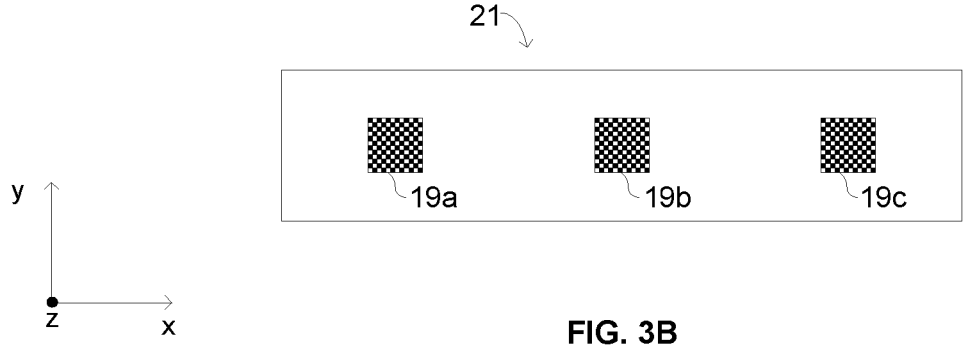

The measurement patterning device MA' and the sensor apparatus 21 are shown in more detail in FIGS. 3A and 3B. Cartesian co-ordinates are used consistently in FIGS. 2, 3A and 3B. FIG. 3A is a schematic illustration of the measurement patterning device MA' in an x-y plane and FIG. 3B is a schematic illustration of the sensor apparatus 21 in an x-y plane.

The measurement patterning device MA' comprises a plurality of patterned regions 15a-15c. In the embodiment which is shown in FIGS. 2 and 3A the measurement patterning device MA' is a reflective patterning device MA'. The patterned regions 15a-15c each comprises a reflective diffraction grating. Radiation which is incident on the patterned regions 15a-15c of the measurement patterning device MA' is at least partially scattered by thereby and received by the projection system PS. In contrast, radiation which is incident on the remainder of the measurement patterning device MA' is not reflected or scattered towards the projection system PS (for example, it may be absorbed by the measurement patterning device MA').

The illumination system IL illuminates the measurement patterning device MA' with radiation. Whilst not shown in FIG. 2, the illumination system IL may receive radiation from a radiation source SO and condition the radiation so as to illuminate the measurement patterning device MA'. For example, the illumination system IL may condition the radiation so as to provide radiation having a desired spatial and angular distribution. In the embodiment which is shown in FIG. 2, the illumination system IL is configured to form separate measurement beams 17a-17c. Each measurement beam 17a-17c illuminates a respective patterned region 15a-15c of the measurement patterning device MA'.

In order to perform a determination of aberrations which are caused by the projection system PL, a mode of the illumination system IL may be changed in order to illuminate the measurement patterning device MA' with separate measurement beams 17a-17c. For example, during normal operation of a lithographic apparatus, the illumination system IL may be configured to illuminate a patterning device MA with a slit of radiation. However the mode of the illumination system IL may be changed such that the illumination system IL is configured to form separate measurement beams 17a-17c in order to perform a determination of aberrations caused by the projection system PL. In some embodiments different patterned regions 15a-15c may be illuminated at different times. For example, a first subset of the patterned regions 15a-15c may be illuminated at a first time so as to form a first subset of measurement beams 17a-17c and a second subset of patterned regions 15a-15c may be illuminated at a second time so as to form a second subset of measurement beams 17a-17c.

In other embodiments the mode of the illumination system IL may be unchanged in order to perform a determination of aberrations caused by the projection system PL. For example, the illumination system IL may be configured to illuminate the measurement patterning device MA' with a slit of radiation (e.g. which substantially corresponds with an illumination area used during exposure of substrates). Separate measurement beams 17a-17c may then be formed by the measurement patterning device MA' since only the patterned regions 15a-15c reflect or scatter radiation towards the projection system PS.

In the Figures the Cartesian co-ordinate system is shown as being conserved through the projection system PS. However, in some embodiments the properties of the projection system PS may lead to a transformation of the co-ordinate system. For example, the projection system PS may form an image of the measurement patterning device MA' which is magnified, rotated and/or mirrored relative to the measurement patterning device MA'. In some embodiments the projection system PS may rotate an image of the measurement patterning device MA' by approximately 180° around the z-axis. In such an embodiment the relative positions of a first measurement beam 17a and a third measurement beam 17c which are shown in FIG. 2, may be swapped. In other embodiments the image may be mirrored about an axis which may lie in an x-y plane. For example, the image may be mirrored about the x-axis or about the y-axis.

In embodiments in which the projection system PS rotates an image of the measurement patterning device MA' and/or the image is mirrored by the projection system PS, the projection system is considered to transform the co-ordinate system. That is, the co-ordinate system which is referred to herein is defined relative to an image which is projected by the projection system PS and any rotation and/or mirroring of the image causes a corresponding rotation and/or mirroring of the co-ordinate system. For ease of illustration, the co-ordinate system is shown in the Figures as being conserved by the projection system PS. However, in some embodiments the co-ordinate system may be transformed by the projection system PS.

The patterned regions 15a-15c modify the measurement beams 17a-17c. In particular, the patterned regions 15a-15c cause a spatial modulation of the measurement beams 17a-17c and cause diffraction in the measurement beams 17a-17c. In the embodiment which is shown in FIG. 3B the patterned regions 15a-15c each comprise two distinct portions. For example, a first patterned region 15a comprises a first portion 15a' and a second portion 15a". The first portion 15a' comprises a diffraction grating which is aligned parallel to a u-direction and the second portion 15a" comprises a diffraction grating which is aligned parallel to a v-direction. The u and v-directions are depicted in FIG. 3A. The u and v-directions are both aligned at approximately 45° relative to both the x and y-directions and are aligned perpendicular to each other. Second 15b and third 15c patterned regions which are shown in FIG. 3A are identical to the first patterned region 15a and each comprise first and second portions whose diffraction gratings are aligned perpendicular to each other.

The first and second portions of the patterned regions 15a-15c may be illuminated with the measurement beams 17a-17c at different times. For example, the first portions of each of the patterned regions 15a-15c may be illuminated by the measurement beams 17a-17c at a first time. At a second time the second portions of each of the patterned regions 15a-15c may be illuminated by the measurement beams 17a-17c. As was mentioned above in some embodiments different patterned regions 15a-15c may be illuminated at different times. For example, the first portions of a first subset of patterned regions 15a-15c may be illuminated at a first time and the first portions of a second subset of patterned regions 15a-15c may be illuminated at a second time. Second portions of the first and second subsets of patterned regions may be illuminated at the same or different times. In general any schedule of illuminating different portions of patterned regions 15a-15c may be used.

The modified measurement beams 17a-17c are received by the projection system PS. The projection system PS forms an image of the patterned regions 15a-15c on the sensor apparatus 21. The sensor apparatus 21 comprises a plurality of diffraction gratings 19a-19c and a radiation detector 23. The diffraction gratings 19a-19c are arranged such that each diffraction grating 19a-19c receives a respective modified measurement beam 17a-17c which is output from the projection system PL. The modified measurement beams 17a-17c which are incident on the diffraction gratings 19a-19c are further modified by the diffraction gratings 19a-19c. The modified measurement beams which are transmitted at the diffraction gratings 19a-19c are incident on the radiation detector 23.

The radiation detector 23 is configured to detect the spatial intensity profile of radiation which is incident on the radiation detector 23. The radiation detector 23 may, for example, comprise an array of individual detector elements or sensing elements. For example, the radiation detector 23 may comprise an active pixel sensor such as, for example, a CMOS (complementary metal-oxide-semiconductor) sensor array. Alternatively, the radiation detector 23 may comprise a CCD (charge-coupled device) sensor array. The diffraction gratings 19a-19c and portions of the radiation sensor 23 at which the modified measurement beams 17a-17c are received form detector regions 25a-25c. For example, a first diffraction grating 19a and a first portion of the radiation sensor 23 at which a first measurement beam 17a is received together form a first detector region 25a. A measurement of a given measurement beam 17a-17c may be made at a respective detector region 25a-25c (as depicted). As was described above, in some embodiments the relative positioning of the modified measurement beams 17a-17c and the co-ordinate system may be transformed by the projection system PS.

The modification of the measurement beams 17a-17c which occurs at the patterned regions 15a-15c and the diffraction gratings 19a-19c of the detector regions 25a-25c results in interference patterns being formed on the radiation detector 23. The interference patterns are related to the derivative of the phase of the measurement beams and depend on aberrations caused by the projection system PS. The interference patterns may therefore be used to determine aberrations which are caused by the projection system PS.

In general, the diffraction gratings 19a-19c of each of the detector regions 25a-25c comprises a two-dimensional transmissive diffraction grating. In the embodiment which is shown in FIG. 3B the detector regions 25a-25c each comprise a two-dimensional diffraction grating 19a-19c. For simplicity (particularly bearing in mind the size of the two-dimensional diffraction gratings 19a-19c in FIG. 3B), the two-dimensional diffraction gratings 19a-19c are represented by checkerboard patterns. As described further below, embodiments of the present invention have particular application to arrangements where the detector regions 25a-25c each comprises a two-dimensional transmissive diffraction grating 19a-19c that is only supported around it perimeter (for example tensioned on a frame). As such, the two-dimensional transmissive diffraction gratings 19a-19c may have different geometries, for example one of the geometries described below and shown in FIGS. 6 to 8.

Illumination of the first portions of the patterned regions 15a-15c may provide information related to aberrations in a first direction and illumination of the second portions of the patterned regions 15a-15c may provide information related to aberrations in a second direction.

In some embodiments, the measurement patterning device MA' and/or the sensor apparatus 21 is sequentially scanned and/or stepped in two perpendicular directions. For example, the measurement patterning device MA' and/or the sensor apparatus 21 may be stepped relative to each other in the u and v-directions. The measurement patterning device MA' and/or the sensor apparatus 21 may be stepped in the u-direction whilst the second portions 15a"-15c" of the patterned regions 15a-15c are illuminated and the measurement patterning device MA' and/or the sensor apparatus 21 may be stepped in the v-direction whilst the first portions 15a'-15c' of the patterned regions 15a-15c are illuminated. That is, the measurement patterning device MA' and/or the sensor apparatus 21 may be stepped in a direction which is perpendicular to the alignment of a diffraction grating which is being illuminated.

The measurement patterning device MA' and/or the sensor apparatus 21 may be stepped by distances which correspond with a fraction of the grating period of the diffraction gratings. Measurements which are made at different stepping positions may be analysed in order to derive information about a wavefront in the stepping direction. For example, the phase of the first harmonic of the measured signal (which may be referred to as a phase stepping signal) may contain information about the derivative of a wavefront in the stepping direction. Stepping the measurement patterning device MA' and/or the sensor apparatus 21 in both the u and v-directions (which are perpendicular to each other) therefore allows information about a wavefront to be derived in two perpendicular directions (in particular, it provides information about a derivative of the wavefront in each of the two perpendicular directions), thereby allowing the full wavefront to be reconstructed.

In addition to stepping of the measurement patterning device MA' and/or the sensor apparatus 21 in a direction which is perpendicular to the alignment of a diffraction grating which is being illuminated (as was described above), the measurement patterning device MA' and/or the sensor apparatus 21 may also be scanned relative to each other. Scanning of the measurement patterning device MA' and/or the sensor apparatus 21 may be performed in a direction which is parallel to the alignment of a diffraction grating which is being illuminated. For example, the measurement patterning device MA' and/or the sensor apparatus 21 may be scanned in the u-direction whilst the first portions 15a'-15c' of the patterned regions 15a-15c are illuminated and the measurement patterning device MA' and/or the sensor apparatus 21 may be scanned in the v-direction whilst the second portions 15a"-15c" of the patterned regions 15a-15c are illuminated. Scanning of the measurement patterning device MA' and/or the sensor apparatus 21 in a direction which is parallel to the alignment of a diffraction grating which is being illuminated allows measurements to be averaged out across the diffraction grating, thereby accounting for any variations in the diffraction grating in the scanning direction. Scanning of the measurement patterning device MA' and/or the sensor apparatus 21 may be performed at a different time to the stepping of the measurement patterning device MA' and/or the sensor apparatus 21 which was described above.

It will be appreciated that a variety of different arrangements of the patterned regions 15a-15c and the detector regions 25a-25c may be used in order to determine aberrations caused by the projection system PS. The patterned regions 15a-15c and/or the detector regions 25a-25c may comprise diffraction gratings. In some embodiments the patterned regions 15a-15c and/or the detector regions 25a-25c may comprise components other than a diffraction grating. For example, in some embodiments the patterned regions 15a-15c and/or the detector regions may comprise a single slit or a pinhole opening through which at least a portion of a measurement beam 17a-17c may propagate. In general the patterned regions and/or the detector regions may comprise any arrangement which serves to modify the measurement beams.

The controller CN receives measurements made at the sensor apparatus 21 and determines, from the measurements, aberrations which are caused by the projection system PS. The controller may be configured to control one or more components of the measurement system 10. For example, the controller CN may control a positioning apparatus PW which is operable to move the sensor apparatus 21 and/or the measurement patterning device MA' relative to each other. The controller may control an adjusting means PA for adjusting components of the projection system PS. For example, the adjusting means PA may adjust optical elements of the projection system PS so as to correct for aberrations which are caused by the projection system PS and which are determined by the controller CN.

In some embodiments, the controller CN may be operable to control the adjusting means PA for adjusting the support structure MT and/or the substrate table WT. For example, the adjusting means PA may adjust support structure MT and/or substrate table WT so as to correct for aberrations which are caused by placement errors of patterning device MA and/or substrate W (and which are determined by the controller CN).

Determining aberrations (which may be caused by the projection system PS or by placement errors of the patterning device MA or the substrate W) may comprise fitting the measurements which are made by the sensor apparatus 21 to Zernike polynomials in order to obtain Zernike coefficients. Different Zernike coefficients may provide information about different forms of aberration which are caused by the projection system PS. Zernike coefficients may be determined independently at different positions in the x and/or the y-directions. For example, in the embodiment which is shown in FIGS. 2, 3A and 3B, Zernike coefficients may be determined for each measurement beam 17a-17c.

In some embodiments the measurement patterning device MA' may comprise more than three patterned regions, the sensor apparatus 21 may comprise more than three detector regions and more than three measurement beams may be formed. This may allow the Zernike coefficients to be determined at more positions. In some embodiments the patterned regions and the detector regions may be distributed at different positions in both the x and y-directions. This may allow the Zernike coefficients to be determined at positions which are separated in both the x and the y-directions.

Whilst, in the embodiment which is shown in FIGS. 2, 3A and 3B the measurement patterning device MA' comprises three patterned regions 15a-15c and the sensor apparatus 21 comprises three detector regions 25a-25c, in other embodiments the measurement patterning device MA' may comprise more or less than three patterned regions 15a-15c and/or the sensor apparatus 21 may comprise more or less than three detector regions 25a-25c.

Methods for determining aberrations caused by a projection system PS are now described with reference to FIG. 4.

In general, measurement patterning device MA' comprises at least one first patterned region 15a-15c and the sensor apparatus 21 comprises at least one second patterned region 19a-19c.

Figure 4:
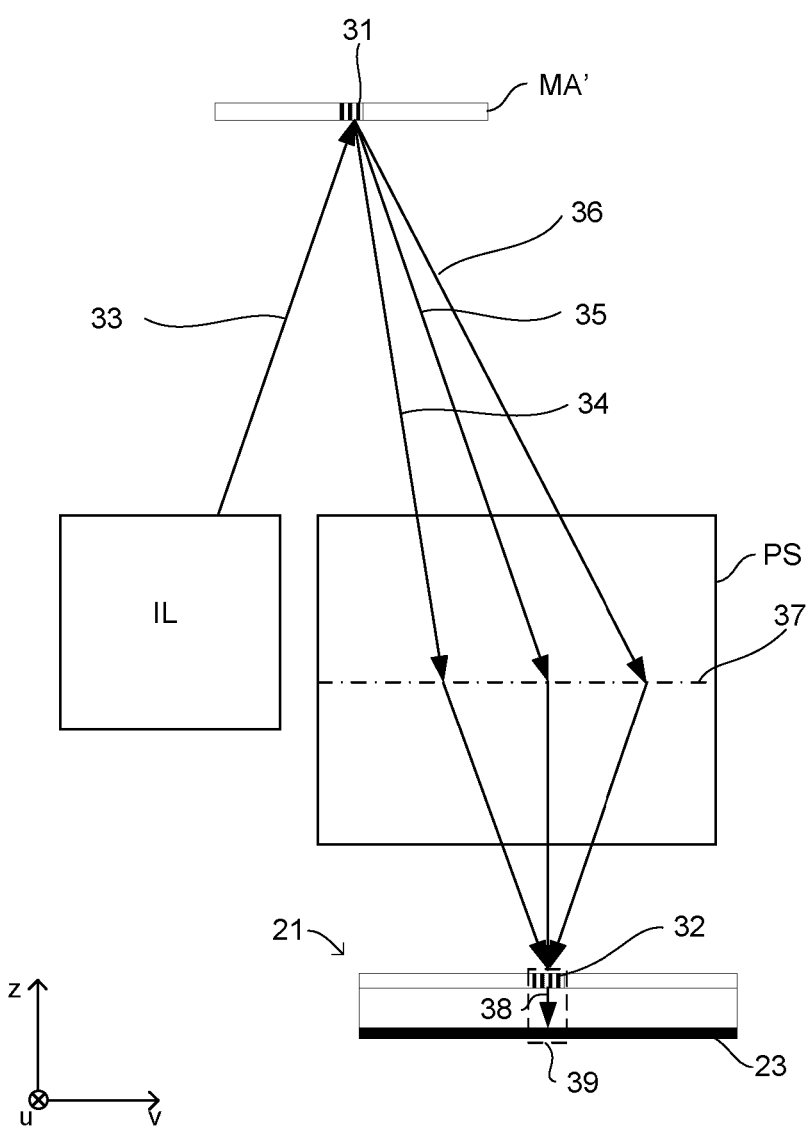
FIG. 4 is a schematic illustration of a measurement system according to an embodiment of the invention, the measurement system comprising a first patterned region and a second patterned region, the first patterned region arranged to receive radiation and to form a plurality of first diffraction beams.

FIG. 4 is a schematic illustration of a measurement system 30 which may be used to determine aberrations which are caused by a projection system PS. Measurement system 30 may be the same as the measurement system 10 shown in FIG. 2, however, it may have a different number of first patterned regions (on measurement patterning device MA') and second patterned regions (in the sensor apparatus 21). Therefore, the measurement system 30 shown in FIG. 4 may include any features of the measurement system 10 shown in FIG. 2 described above and these features will not be further described below.

In FIG. 4, only a single first patterned region 31 is provided on the measurement patterning device MA' and a single second patterned region 32 is provided in the sensor apparatus 21.

The measurement patterning device MA' is irradiated with radiation 33 from the illumination system IL. For ease of understanding only a single line (which may, for example, represent a single ray, for example the chief ray, of an incident radiation beam) is shown in FIG. 4. However, it will be appreciated that the radiation 33 will comprise a range of angles incident on the first patterned region 31 of the measurement patterning device MA'. That is, each point on the first patterned region 31 of the measurement patterning device MA' may be illuminated by a cone of light. In general, each point is illuminated by substantially the same range of angles, this being characterized by the intensity of radiation in a pupil plane of the illumination system IL (not shown).

The first patterned region 31 is arranged to receive the radiation 33 and to form a plurality of first diffraction beams 34, 35, 36. A central first diffraction beam 35 corresponds to a $0^{th}$ order diffraction beam of first patterned region 31 and the other two first diffraction beams 34, 36 correspond to the $\pm1^{st}$ order diffraction beams of first patterned region 31. It will be appreciated that more, higher order diffraction beams will, in general, also be present. Again for ease of understanding, only three first diffraction beams 34, 35, 36 are shown in FIG. 4.

It will also be appreciated that, as the incoming radiation 33 comprises a cone of radiation converging on a point on the first patterned region 31, each of the first diffraction beams 34, 35, 36 also comprises a cone of radiation diverging from that point on the first patterned region 31.

To achieve the generation of the first diffraction beams 34, 35, 36, the first patterned region 31 may be of the form of a diffraction grating. For example, the first patterned region 31 may be generally of the form of the patterned region 15a shown in FIG. 3A. In particular, at least a portion of the first patterned region 31 may be of the form of the first portion 15a' of the patterned region 15a shown in FIG. 3A, i.e. a diffraction grating which is aligned parallel to a u-direction (note that FIG. 4 is shown in the z-v plane). Therefore, the first diffraction beams 34-36 are separated in a shearing direction, which is the v-direction.

The first diffraction beams 34-36 are at least partially captured by the projection system PS, as now described. How much of the first diffraction beams 34-36 is captured by the projection system PS will be dependent on: the pupil fill of the incident radiation 33 from the illumination system IL; the angular separation of the first diffraction beams 34-36 (which in turn is dependent on the pitch of the first patterned region 31 and the wavelength of the radiation 33); and the numerical aperture of the projection system PS.

The measurement system 30 may be arranged such that first diffraction beam 35 that corresponds to the $0^{th}$ order diffraction beam substantially fills the numerical aperture of the projection system PS, which may be represented by a circular region of a pupil plane 37 of the projection system PS, and the first diffraction beams 34, 36 that correspond to the $\pm1^{st}$ order diffraction beams overlap significantly with the first diffraction beam 35 that corresponds to the $0^{th}$ order diffraction beam. With such an arrangement, substantially all of the first diffraction beam 35 that corresponds to the $0^{th}$ order diffraction beam and most of the first diffraction beams 34, 36 that correspond to the $\pm1^{st}$ order diffraction beams is captured by the projection system PS and projected onto the sensor apparatus 21. (Furthermore, with such an arrangement a large number of diffraction beams generated by the first patterned region 31 are at least partially projected onto the sensor apparatus 21).

The role of the first patterned region 31 is to introduce spatial coherence, as now discussed.

In general, two rays of radiation 33 from the illumination system IL that are incident on the same point of the measurement patterning device MA' at different angles of incidence are not coherent. By receiving the radiation 33 and forming a plurality of first diffraction beams 34, 35, 36, the first patterned region 31 may be considered to form a plurality of copies of the incident radiation cone 33 (the copies having, in general different phases and intensities). Within any one of these copies, or first diffraction beams 34, 35, 36, two rays of radiation which originate from the same point on the measurement patterning device MA' but at different scattering angles, are not coherent (due to the properties of the illumination system IL). However, for a given ray of radiation within any one of the first diffraction beams 34, 35, 36 there is a corresponding ray of radiation in each of the other first diffraction beams 34, 35, 36 that is spatially coherent with that given ray. For example, the chief rays of each of the first diffraction beams 34, 35, 36 (which correspond to the chief ray of the incident radiation 33) are coherent and could, if combined, interfere at the amplitude level.

This coherence is exploited by the measurement system 30 to determine an aberration map of the projection system PS.

The projection system PS projects part of the first diffraction beams 34, 35, 36 (which is captured by the numerical aperture of the projection system) onto the sensor apparatus 21.

In FIG. 4, the sensor apparatus 21 comprises the single second patterning region 32. As described further below (with reference to FIGS. 5A-5C), second patterned region 32 is arranged to receive these first diffraction beams 34-36 from the projection system PS and to form a plurality of second diffraction beams from each of the first diffraction beams. In order to achieve this, the second patterning region 32 comprises a two-dimensional transmissive diffraction grating. In FIG. 4, all radiation that is transmitted by the second patterning region 32 is represented as a single arrow 38. This radiation 38 is received by a detector region 39 of the radiation detector 23 and is used to determine the aberration map.

Each of the first diffraction beams 34-36 that is incident on the patterning region 32 will diffract to from a plurality of second diffraction beams. Since the second patterning region 32 comprises a two-dimensional diffraction grating, from each incident first diffraction beam, a two dimensional array of secondary diffraction beams is produced (the chief rays of these secondary diffraction beams being separated in both the shearing direction (v-direction) and the direction perpendicular thereto (the u-direction). In the following, a diffraction order that is $n^{th}$ order in the shearing direction (the v-direction) and m order in the non-shearing direction (the u-direction) will be referred to as the $(n, m)^{th}$ diffraction order of the second patterned region 32. In the following, where it is not important what order a second diffraction beam is in the non-shearing direction (the u-direction), the $(n, m)^{th}$ diffraction order of the second patterned region 32 may be referred to simply as the $n^{th}$ order second diffraction beam.

Figure 5A:
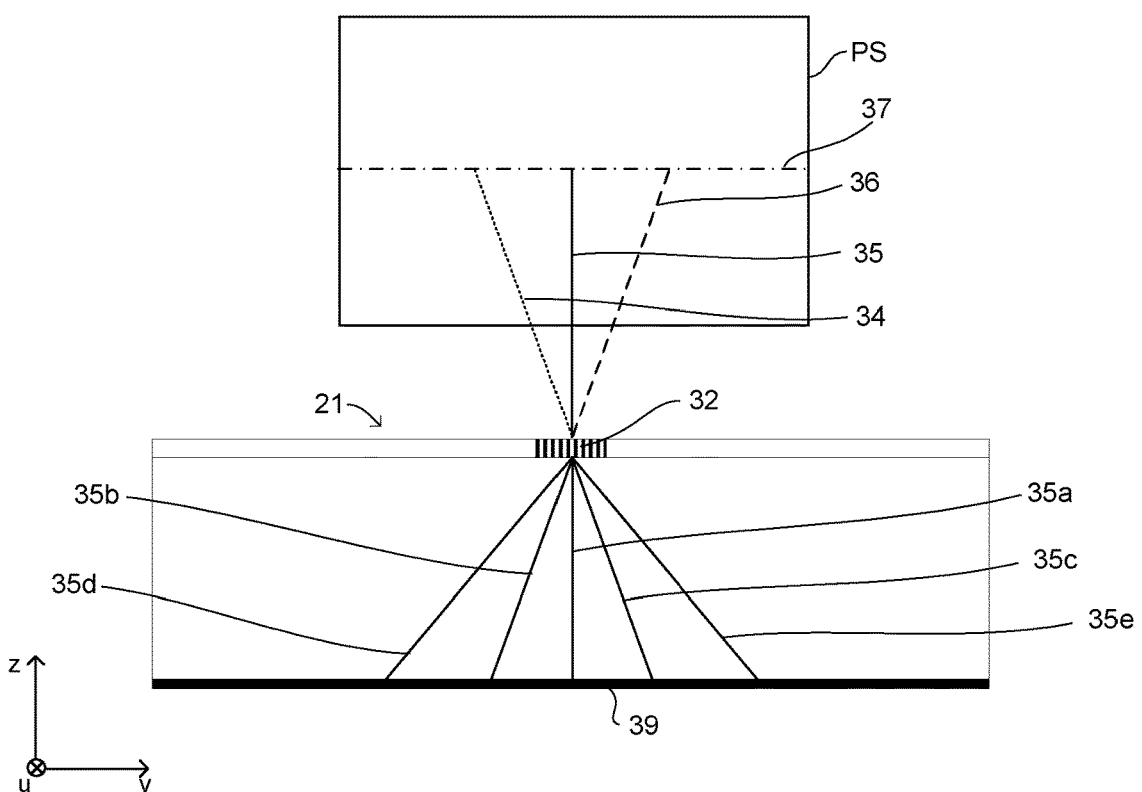
FIGS. 5A to 5C each shows a different set of second diffraction beams formed by the second patterned region of the measurement system shown in FIG. 4, that set of second diffraction beams having been produced by a different first diffraction beam formed by the first patterned region.
Figure 5B:
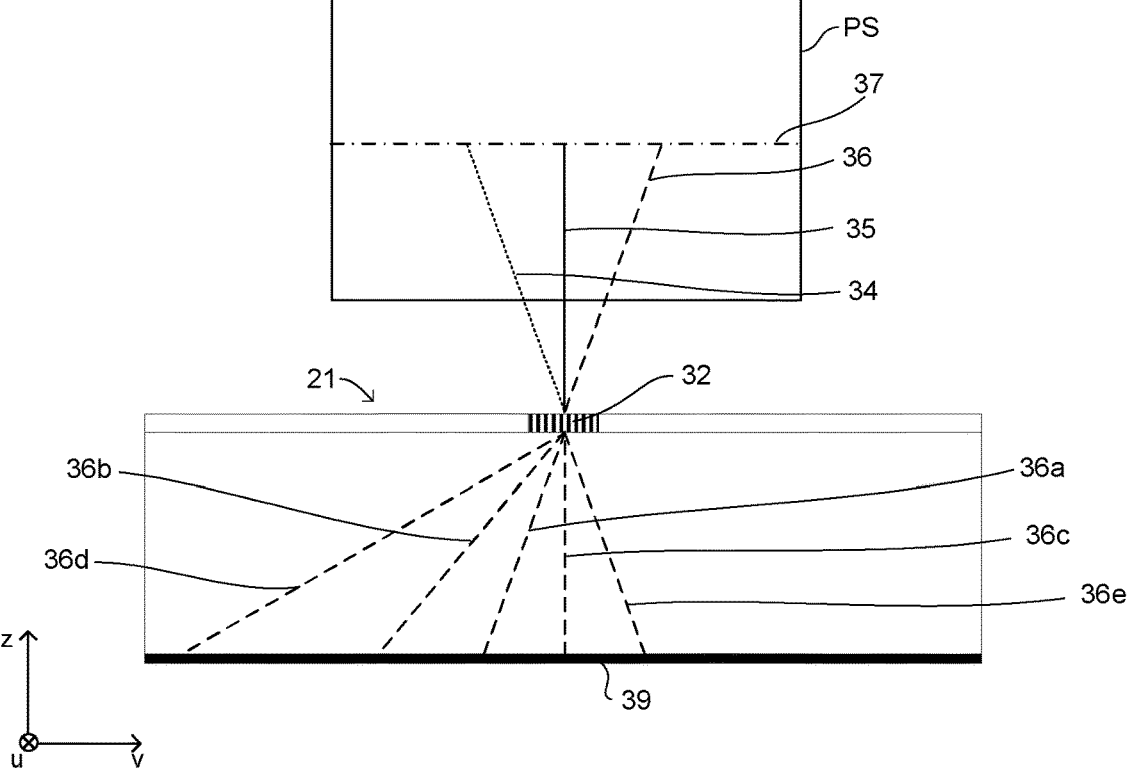
Figure 5C:
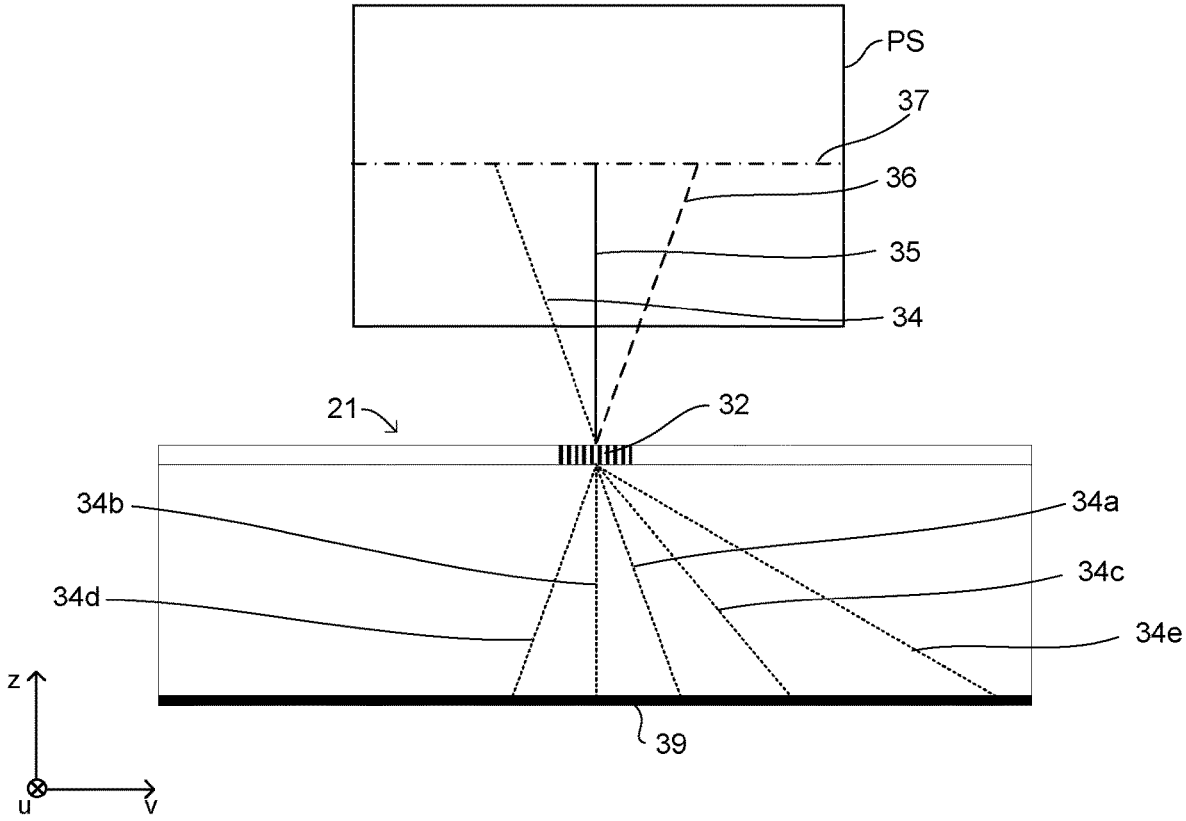

FIGS. 5A to 5C show a set of second diffraction beams produced by each of the first diffraction beams 34-36. FIG. 5A shows a set of second diffraction beams 35$a$-35$e$ produced by the first diffraction beam 35 that corresponds to the $0^{th}$ order diffraction beam of first patterned region 31. FIG. 5B shows a set of second diffraction beams 36$a$-36$e$ produced by the first diffraction beam 36 that corresponds to the $-1^{st}$ order diffraction beam of first patterned region 31. FIG. 5C shows a set of second diffraction beams 34$a$-34$e$ produced by the first diffraction beam 34 that corresponds to the +P" order diffraction beam of first patterned region 31.

In FIG. 5A, second diffraction beam 35$a$ corresponds to the $0^{th}$ order diffraction beam (of second patterned region 32, and in the shearing direction), whereas second diffraction beams 35$b$, 35$c$ correspond to the $\pm 1^{st}$ order diffraction beams and second diffraction beams 35$d$, 35$e$ correspond to the $\pm 2^{nd}$ order diffraction beams. It will be appreciated that FIGS. 5A-5C are shown in the v-z plane and the shown second diffraction beams may, for example, correspond to $0^{th}$ order diffraction beam of second patterned region 32 in the non-shearing direction (i.e. the u-direction). It will be further appreciated that there will be a plurality of copies of these second diffraction beams, representing higher order diffraction beams in the non-shearing direction that are into or out of the page of FIGS. 5A-5C.

In FIG. 5B, second diffraction beam 36$a$ corresponds to the $0^{th}$ order diffraction beam (of second patterned region 32, and in the shearing direction), whereas second diffraction beams 36$b$, 36$c$ correspond to the $\pm 1^{st}$ order diffraction beams and second diffraction beams 36$d$, 36$e$ correspond to the $\pm 2^{nd}$ order diffraction beams.

In FIG. 5C, second diffraction beam 34$a$ corresponds to the $0^{th}$ order diffraction beam (of second patterned region 32, and in the shearing direction), whereas second diffraction beams 34$b$, 34$c$ correspond to the $\pm 1^{st}$ order diffraction beams and second diffraction beams 34$d$, 34$e$ correspond to the $\pm 2^{nd}$ order diffraction beams.

It can be seen from FIGS. 5A-5C that several of the second diffraction beams spatially overlap with each other. For example, the second diffraction beam 35$b$ that corresponds to the $-1^{st}$ order diffraction beam of second patterned region 32, which originates from the $0^{th}$ order diffraction beam 35 of first patterned region 31 overlaps with the second diffraction beam 36$a$ that corresponds to the $0^{th}$ order diffraction beam of second patterned region 32, which originates from the $-1^{st}$ order diffraction beam 36 of first patterned region 31. All of the lines in FIGS. 4 and 5A-5C may be considered to represent a single ray of radiation that originates from a single input ray 33 from the illumination system IL. Therefore, as explained above, these lines represent spatially coherent rays that, if spatially overlapping at radiation detector 23 will produce an interference pattern. Furthermore, the interference is between rays which have passed though different parts of the pupil plane 37 of the projection system PS (which are separated in the shearing direction). Therefore, the interference of radiation that originates from a single input ray 33 is dependent on phase differences between two different parts of the pupil plane.

This spatial overlapping and spatial coherence of the second diffraction beams at radiation detector 23 is achieved by matching the first and second patterned regions 31, 32 such that the angular separation (in the shearing direction) between different second diffraction beams that originate from a given first diffraction beam is the same as the angular separation (in the shearing direction) between different first diffraction beams as they converge on the second patterned region 32. This spatial overlapping and spatial coherence of the second diffraction beams at radiation detector 23 is achieved by matching the pitches of the first and second patterned regions 31, 32 in the shearing direction. It will be appreciated that this matching of the pitches of the first and second patterned regions 31, 32 in the shearing direction takes into account any reduction factor applied by the projection system PS. As used herein, the pitch of a two dimensional diffraction grating in a particular direction is defined as follows.

It will be appreciated that a one-dimensional diffraction grating comprises a series of lines that are formed from a repeating pattern (of reflectivity or transmissivity) in a direction perpendicular to these lines. In the direction perpendicular to the lines, the smallest non-repeating section from which the repeating pattern is formed is referred to as the unit cell and the length of this unit cell is referred to as the pitch of the one-dimensional diffraction grating. In general, such a one-dimensional diffraction grating will have a diffraction pattern such that an incident radiation beam will be diffracted so as to form a one-dimensional array of angularly spaced (but potentially spatially overlapping) diffraction beams. The first patterned region 31 forms such a one-dimensional array of angularly spaced first diffraction beams 34-36, which are offset (angularly spaced) in the shearing direction.

It will be appreciated that a two-dimensional diffraction grating comprises a two-dimensional repeating pattern of reflectivity or transmissivity. The smallest non-repeating section from which this repeating pattern is formed may be referred to as the unit cell. The unit cell may be square and a fundamental pitch of such a two-dimensional diffraction grating may be defined as a length of the square unit cell. In general, such a two dimensional diffraction grating will have a diffraction pattern such that an incident radiation beam will be diffracted so as to form a two dimensional array of, angularly spaced (but potentially spatially overlapping) diffraction beams. The axes of this two-dimensional (square) array of diffraction beams are parallel to the sides of the unit cell. The angular separation between adjacent diffraction beams in these two directions may be given by the ratio of the wavelength of the radiation to the pitch of the grating.

Therefore, the smaller the pitch, the larger the angular separation between the adjacent diffraction beams.

In some embodiments, the axes of the unit cell of the two-dimensional second patterned region 32 may be arranged at a non-zero angle to the shearing and non-shearing directions as defined by the first patterned region 31. For example, the axes of the unit cell of the two-dimensional second patterned region 32 may be arranged at 45° to the shearing and non-shearing directions as defined by the first patterned region 31. As previously explained, spatial overlapping and spatial coherence of the second diffraction beams at radiation detector 23 which allows the wavefront to be measured is achieved by ensuring that that the angular separation (in the shearing direction) between different second diffraction beams that originate from a given first diffraction beam is the same as the angular separation (in the shearing direction) between different first diffraction beams as they converge on the second patterned region 32. For an arrangement wherein the axes of the unit cell of the two-dimensional second patterned region 32 are arranged at a non-zero angle (for example 45°) to the shearing and non-shearing directions, it can be useful to define a pseudo-unit cell and a pseudo-pitch as follows. The pseudo-unit cell is defined as the smallest non-repeating square from which the repeating pattern of the diffraction grating is formed, which is orientated such that its sides are parallel to the shearing and non-shearing directions (as defined by the first patterned region 31). The pseudo-pitch may be defined as a length of the square pseudo-unit cell. This may be referred to as the pitch of a two dimensional diffraction grating in the shearing direction. It is this pseudo-pitch which should be matched to (an integer multiple or fraction of) the pitch of the first patterned region 31.

The diffraction pattern of the diffraction grating may be considered to form a two dimensional array of angularly spaced (but potentially spatially overlapping) pseudo-diffraction beams, the axes of this two-dimensional (square) array of pseudo-diffraction beams being parallel to the sides of the pseudo-unit cell. Since this square is not the unit cell (defined as to the smallest square of any orientation from which the repeating pattern of the diffraction grating is formed), the pseudo-pitch will be larger than the pitch (or fundamental pitch). Therefore, there will a smaller separation between adjacent pseudo-diffraction beams in the diffraction pattern (in a direction parallel to the sides of the pseudo-unit cell) than there is between adjacent diffraction beams in the diffraction pattern (in a direction parallel to the sides of the unit cell). This can understood as follows. Some of the pseudo-diffraction beams correspond to diffraction beams in the diffraction pattern and the other pseudo-diffraction beams are unphysical and do not represent a diffraction beam generated by the diffraction grating (and only arise due to the use of a pseudo-unit cell that is larger than the true unit cell).

Taking any reduction (or enlargement) factor applied by the projection system PS into account, either the pitch of the second patterned region 32 in the shearing direction should be an integer multiple of the pitch of the first patterned region 31 in the shearing direction or the pitch of the first patterned region 31 in the shearing direction should be an integer multiple of the pitch of the second patterned region 32 in the shearing direction. In the example shown in FIGS. 5A-5C, the pitches of the first and second patterned regions 31, 32 in the shearing direction are substantially equal (taking into account any reduction factor).

As can be seen from FIGS. 5A-5C, each point on the detector region 39 of the radiation detector 23 will, in general, receive several contributions that are summed coherently. For example, the point on the detector region 39 which receives the second diffraction beam 35b that corresponds to the $-1^{th}$ order diffraction beam of second patterned region 32, which originates from the $0^{th}$ order diffraction beam 35 of first patterned region 31 overlaps with both: (a) the second diffraction beam 36a that corresponds to the $0^{th}$ order diffraction beam of second patterned region 32, which originates from the $-1^{th}$ order diffraction beam 36 of first patterned region 31; and (b) the second diffraction beam 34d that corresponds to the $-2^{nd}$ order diffraction beam of second patterned region 32, which originates from the $+1^{st}$ order diffraction beam 34 of first patterned region 31. It will be appreciated that when higher order diffraction beams of the first patterned region 31 are taken into account there will be more beams that should be summed coherently at each point on the detector region 39 in order to determine the intensity of radiation as measured by that part of the detector region 39 (for example a corresponding pixel in a two dimensional array of sensing elements).

In general, a plurality of different second diffraction beams contributes to the radiation received by each part of the detector region 39. The intensity of radiation from such a coherent sum is given by:

$$I = DC + \Sigma_{pairs\ [i]}\gamma_i \cos(\Delta\phi_i), \qquad (2)$$

where DC is a constant term (which is equivalent to the incoherent sum of the different diffraction beams), the sum is over all pairs of different second diffraction beams, $\gamma_i$ is an interference strength for that pair of second diffraction beams and $\Delta\phi_i$ is a phase difference between that pair of second diffraction beams.

The phase difference $\Delta\phi_i$ between a pair of second diffraction beams is dependent on two contributions: (a) a first contribution relates to the different part of the pupil plane 37 of the projection system PS from which they originate; and (b) a second contribution relates to the position within the unit cells of each of the first and second patterned regions 31, 32 from which they originate.

The first of these contributions can be understood to arise from the fact that the different coherent radiation beams have passed through different parts of the projection system PS and are therefore related to the aberrations that it is desired to determine (in fact they are related to a difference between two points in the aberration map that are separated in the shearing direction).

The second of these contributions can be understood to arise from the fact that the relative phases of multiple rays of radiation that arise from a single ray incident on a diffraction grating will depend on which part of the unit cell of that grating the ray was incident. This therefore does not contain information relating to the aberrations. As explained above, in some embodiments, the measurement patterning device MA' and/or the sensor apparatus 21 are sequentially scanned and/or stepped in the shearing direction. This causes the phase differences between all of pairs of interfering radiation beams received by the radiation detector 23 to change. As the measurement patterning device MA' and/or the sensor apparatus 21 are sequentially stepped in the shearing direction by an amount that is equivalent to a fraction of the pitches (in the shearing direction) of the first and second patterned regions 31, 32, in general, the phase differences between pairs of second diffraction beams will all change. If the measurement patterning device MA' and/or the sensor apparatus 21 are stepped in the shearing direction by an amount that is equivalent to an integer multiple of the pitches (in the shearing direction) of the first and second patterned regions 31, 32 the phase differences between pairs of second diffraction beams will remain the same. Therefore, as the measurement patterning device MA' and/or the sensor apparatus 21 are by sequentially scanned and/or stepped in the shearing direction, the intensity received by each part of the radiation detector 23 will oscillate. The first harmonic of this oscillating signal (which may be referred to as a phase-stepping signal), as measured by the radiation detector 23, is dependent on the contributions to equation (1) that arise from adjacent first diffraction beams 34-36, i.e. first diffraction beams that differ in order by ±1. Contributions that arise from first diffraction beams that differ in order by a different amount will contribute to higher order harmonics of the signal determined by the radiation detector 23 due to such phase stepping techniques.

For example, of the three overlapping second diffraction beams discussed above (35b, 36a and 34d) only two of the three possible pairs of these diffraction beams will contribute to the first harmonic of the phase stepping signal: (a) second diffraction beams 35b and 36a (which originate from the $0^{th}$ order diffraction beam 35 and the $-1^{th}$ order diffraction beam 36 of first patterned region 31 respectively); and (b) second diffraction beams 35a and 34d (which originate from the $0^{th}$ order diffraction beam 35 and the $+1^{th}$ order diffraction beam 34 of first patterned region 31 respectively).

Each pair of second diffraction beams will result in an interference term of the form shown in equation (2), which contributes to the first harmonic of the phase stepping signal, i.e. an interference term of the form:

$$\gamma \cos\left(\frac{2\pi}{p} \cdot v + \Delta W\right) \tag{3}$$

where $\gamma$ is an amplitude of the interference term, p is the pitch of the first and second patterned regions 31, 32 (in the shearing direction), v parameterizes the relative positions of the first and second patterned regions 31, 32 in the shearing direction and $\Delta W$ is a difference between the value of the aberration map at two positions in the pupil plane of the projection system PS, the two positions corresponding to the positions from which the two second diffraction beams originate. The amplitude $\gamma$ of the interference term is proportional to the product of the compound scattering efficiencies of the two second diffraction beams, as discussed further below. The frequency of the first harmonic of the phase stepping signal is given by the inverse of the pitch p of the first and second patterned regions 31, 32 in the shearing direction. The phase of the phase stepping signal is given by $\Delta W$ (the difference between the values of the aberration map at two positions in the pupil plane of the projection system PS, the two positions corresponding to the positions from which the two second diffraction beams originate).

The interference strength $\gamma_i$ for a pair of second diffraction beams is proportional to the product of the compound scattering efficiencies of the two second diffraction beams, as now discussed.

In general, the scattering efficiency of the diffraction beams produced by a diffraction grating will depend on the geometry of the grating. These diffraction efficiencies, which may be normalised to the efficiency of a $0^{th}$ order diffraction beam, describe the relative intensities of the diffraction beams. As used herein, the compound scattering efficiency of a second diffraction beam is given by the product of the scattering efficiency of the first diffraction beam from which it originates and the scattering efficiency for the diffraction order of the second patterned region 32 to which it corresponds.

In the above description of the embodiments shown in FIG. 3A to 5C, where the first portion 15a' of the patterned region 15a shown in FIG. 3A is illuminated, the shearing direction corresponds to the v-direction and the non-shearing direction corresponds to the u-direction. It will be appreciated that when the second portion 15a" of the patterned region 15a shown in FIG. 3A is illuminated, the shearing direction corresponds to the u-direction and the non-shearing direction corresponds to the v-direction. Although in these above-described embodiments, the u and v-directions (which define the two shearing directions) are both aligned at approximately 45° relative to both the x and y-directions of the lithographic apparatus LA, it will be appreciated that in alternative embodiments the two shearing directions may be arranged at any angle to the x and y-directions of the lithographic apparatus LA (which may correspond to non-scanning and scanning directions of the lithographic apparatus LA). In general, the two shearing directions will be perpendicular to each other. In the following, the two shearing directions will be referred to as the x-direction and the y-direction. However, it will be appreciated that these shearing directions may be arranged at any angle relative to both the x and y-directions of the lithographic apparatus LA.

Some embodiments of the present invention relate to a two-dimensional diffraction grating, which may form the second patterned region 32 described above with reference to FIGS. 4 to 5C. In particular, embodiments of the present invention relate to such a two-dimensional diffraction grating which comprises an absorbing layer provided with a square array of through-apertures, wherein the absorbing layer is formed from a material which has a refractive index (for the radiation that will be used in the measurement system, for example EUV radiation) that is close to the refractive index of the medium disposed in the through apertures. In the following, unless otherwise stated, any use of the term refractive index should be understood to mean the refractive index for radiation having a first wavelength that is used in a measurement system 10 that the two-dimensional grating will, in use, form part of (for example as a second patterned region 32). The radiation having a first wavelength may, for example, comprise EUV radiation.

In many embodiments the medium disposed in the through apertures may comprise a low pressure gas, for example hydrogen or air. For such embodiments, the medium within the through-apertures will have a refractive index of approximately 1. Therefore, for such embodiments, the absorbing layer of the two-dimensional grating may have a refractive index which is close to 1. For example, the absorbing layer may be formed from a material which has a refractive index which is close to 1 for the radiation having the first wavelength (i.e. in the range 0.96 to 1.04 such that $|n-1| \le 0.04$) the two-dimensional transmissive diffraction grating will be less sensitive to such errors.

One known type of two-dimensional diffraction grating that is used in a measurement of the type described above with reference to FIGS. 2 to 5C is comprises a membrane formed from an absorbing layer that is supported by a support layer is now described with reference to FIG. 6.

Figure 6:
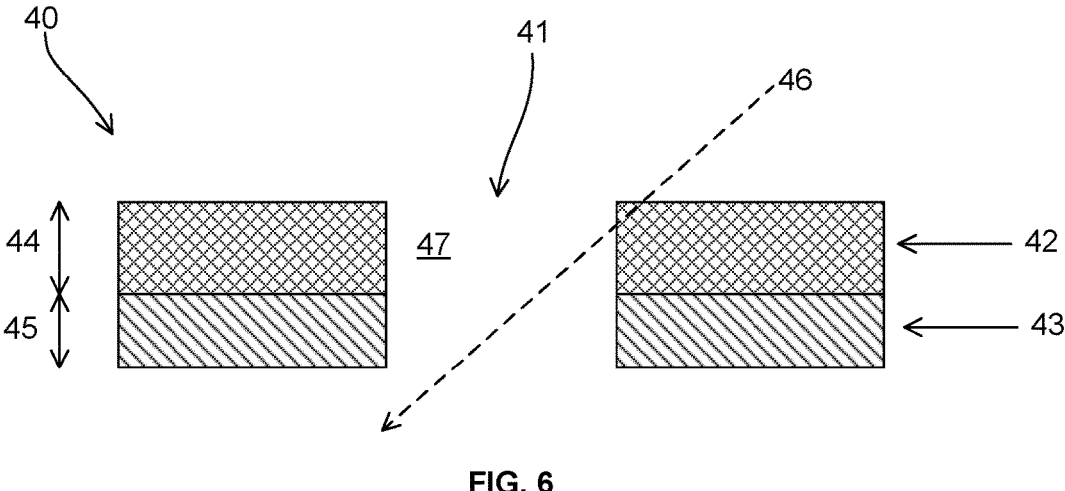
FIG. 6 shows a cross section of a portion of a membrane forming a known two-dimensional diffraction grating through one of the apertures of the grating, the grating comprising an absorbing layer and an adjacent support layer.

FIG. 6 shows a cross section of a portion of a membrane forming a known two-dimensional diffraction grating 40 through one of the apertures 41 of the grating. The known diffraction grating 40 comprises an absorbing layer 42 and an adjacent support layer 43. The absorbing layer 42 and adjacent support layer 43 are both patterned with a square array of apertures 41 (only one is shown in FIG. 6). The absorbing layer 42 is formed from chromium and has a thickness of 125 nm. The support layer 43 comprises $Si_3N_4$ and has a thickness of 100 nm. The support layer 43 provides mechanical support for the absorbing layer 42.

The extinction coefficient for chromium is sufficiently high that when EUV radiation propagates through a 125 nm thickness of chromium it may be attenuated in intensity by a factor of the order of 0.01 (i.e. such that only ~1% of the EUV radiation propagates through the chromium). That is, the extinction coefficient is sufficiently high that at this thickness one would expect most of the radiation which is incident on the absorbing layer 42 to be blocked by the absorbing layer 42 (and for the grating to act like a true binary grating).

However, the inventors of the present invention have realised that, in use, radiation may be incident on the two-dimensional grating 40 at a range of angles. In particular, for high numerical aperture projections systems, the radiation may be incident at a large range of angles. Further, the inventors have realised that, as a result, at least some of the radiation that is incident on the absorbing layer 42 (for example at a large angle of incidence and close to one of the through apertures 41) will propagate through a distance in the absorbing layer 42 that is only a small fraction of the thickness of the absorbing layer 42 and will therefore not be fully attenuated. One example ray 46 of radiation which may only be partially attenuated is shown in FIG. 6. This ray 46 can be considered to represent a plane wave. Since the plane wave represented by ray 46 is incident on the two-dimensional grating 40 at a large angle, at the edges of the absorbing layer 42 adjacent the apertures 41 the plane wave is not fully attenuated. As a result, this plane wave will not see a binary grating rather will see a grating with a "blurred edge" with a transitional attenuation. This will lead to unwanted diffraction amplitudes, which in turn causes a measurement error.

The inventors have also realised that, in general, if there is a significant difference in refractive index between the absorbing layer 42 and the surrounding medium 47 (which will be in the through-apertures 41) then there will be a phase difference induced between the radiation that propagates through the absorbing layer 42 and the radiation that does not (due to the different optical path lengths experienced). The refractive index of chromium is ~0.93 whereas the refractive index of air (which may be the surrounding medium 47 in the through-apertures 41) is 1. Therefore, there is a difference significant difference in refractive index between the absorbing layer 42 and the surrounding medium 47. This causes some distortion of the wavefront of the incident radiation. In turn, this will give rise to interference effects which will affect the measurements made by the phase-stepping measurement system.

A new diffraction grating according to one embodiment of the present invention is now described with reference to FIG. 7.

Figure 7:
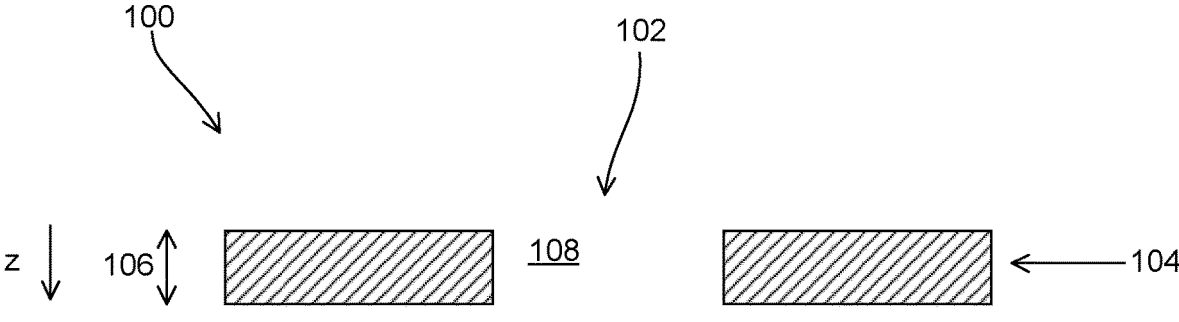
FIG. 7 shows a cross section of a portion of a membrane forming a new two-dimensional diffraction grating through one of the apertures of the grating, the grating comprising a single absorbing layer.

FIG. 7 shows across section of a portion of a membrane forming a new two-dimensional diffraction grating 100 through one of the apertures 102 of the grating 100. The new diffraction grating 100 comprises an absorbing layer 104. The absorbing layer 104 is patterned with a square array of apertures 104 (only one is shown in FIG. 7). The absorbing layer 104 is formed from aluminium nitride (AlN). The absorbing layer 104 has a thickness of around 80 nm to 110 nm, for example 100 nm.

The new diffraction grating 100 shown in FIG. 7 has a number of advantages over the known diffraction grating 40 shown in FIG. 6, as now discussed.

First, the difference in refractive index of the absorbing layer 104 of the new grating 100 and the medium 108 within the through apertures 102 is significantly smaller than the difference in refractive index of the absorbing layer 42 of the known grating 40 and the medium 47 in the apertures 41. In general, in use, the surrounding medium 47, 108 for one of the two gratings 40, 100 may be a low pressure gas, for example hydrogen or air and will have a refractive index of approximately 1. The refractive index for aluminium nitride for EUV radiation is approximately 0.98. Therefore the difference in refractive index of the absorbing layer 104 of the new grating 100 and the refractive index of the medium 108 within the through apertures 102 is approximately 0.02. In contrast, the refractive index of chromium for EUV radiation is approximately 0.93. Therefore the difference in refractive index of the absorbing layer 42 of the known grating 40 and the refractive index of the medium 47 within the through apertures 41 is approximately 0.07. Advantageously, this results in less wavefront deformation by absorbing layer 104 of the new grating than by the absorbing layer 42 of the known grating 40. As a result, any wavefront measuring system (such as the phase stepping shearing interferometer systems described above with reference to FIGS. 2 to 5C) which uses the new grating 100 will have smaller errors than a similar system using the know grating 40.

It will be appreciated that in order to minimise wavefront distortion by the absorbing layer, a material which has a refractive index which is close to 1 has been selected because the medium in the apertures typically has a refractive index of close to 1. In other words, the refractive index may of the absorbing material has been matched to that of the transmissive medium within the apertures (by selecting an absorbing material with a refractive index close to 1. In alternative embodiments, the refractive index may of the absorbing material may be matched in this way to another transmissive medium which may be provided in the apertures (and which may have a refractive index which differs from 1). However, in order to maximise the amount of radiation which passes through the grating and is detected by a radiation detector, embodiments wherein the apertures are filled with a low pressure gas may be preferred.

It is thought that this is at least partially attributable to the fact that the absorbing layer 104 comprises aluminium. This is because, advantageously, the refractive index of aluminium for EUV radiation is approximately 1 (such that it will not cause significant wavefront distortion due to a difference in refractive index between the absorbing layer and the surrounding medium). Furthermore, aluminium has an extinction coefficient for EUV radiation that is comparable to that of chromium (which is used as the absorbing layer 42 in the known grating 40). The extinction coefficient of chromium is $k_{Cr}$=0.039 whereas the extinction coefficient of Aluminium is $k_{Al}$=0.030 (the extinction coefficient of AlN $k_{AlN}$=0.030). A layer of AlN having a thickness of 100 nm will result in ~6% EUV leakage, i.e. ~6% of the EUV radiation incident on the absorbing layer 104 will be transmitted. In contrast, an absorbing layer 42 of chromium having a thickness of 125 nm will result in <1% of the EUV radiation incident on the absorbing layer 42 being transmitted. As a result, the use of the new diffraction grating 100 will result in a slight reduction in contrast in the phase curve (as compared to using the known grating 40). However, the use of the new diffraction grating 100 will result in an increase in the accuracy of the measurement (as compared to using the known grating 40) due to a reduction in wavefront errors (resulting in the smaller optical path difference due to the reduced difference in refractive indices of the absorbing layer 104 and the medium 108 within the through apertures 102).

However, for embodiments wherein the absorbing layer only comprises aluminium, the grating may also need an additional support to provide mechanical additional support. Furthermore, the use of an additional support layer adjacent the absorbing layer will result in additional wavefront errors (due to a difference in refractive index between the support layer and the medium 108 within the through apertures 102).

Advantageously, by using a ceramic material (aluminium nitride) comprising aluminium, the absorbing layer 104 is stronger and does not need any such adjacent support layer. It will be appreciated that other ceramics which contain aluminium may also be suitable for use as the absorbing layer 104. Furthermore, ceramics containing other metals or metalloids which have relatively high extinction coefficients for the radiation (for example EUV radiation) and refractive indices for this radiation that are close to 1 may alternatively be used. The ceramic may comprise a metal or metalloid component having a relatively high extinction coefficient for EUV radiation and a non-metal component. Both components may have a refractive index for EUV which is relatively close to 1.

Aluminium nitride has an extinction coefficient for EUV of approximately $k_{AlN}{\sim}0.030$.

Advantageously, the new grating 100 comprises a membrane which only comprises a single absorbing layer 104 of aluminium nitride. This is in contrast to the known grating 40 which has a membrane that comprises both an absorbing layer 42 of chromium and a support layer 43 of $Si_3N_4$.

Aluminium nitride has similar mechanical properties to $Si_3N_4$ and therefore no additional mechanical support layer is required.

As a result, the membrane of the grating of the new grating 100 has a significantly reduced thickness relative to the membrane of the known grating 40. The membrane of the new grating 100 comprises the absorbing layer only (having a thickness of 100 nm). In contrast, the membrane of the known grating 40 comprises an absorbing layer 42 (having a thickness of 125 nm) and a support layer 43 (having a thickness of 100 nm) adjacent the absorbing layer 42. Therefore, the total thickness of the membrane of the known grating 40 is 225 nm.

Advantageously, this reduced thickness of the membrane of the grating of the new grating 100 (relative to the membrane of the known grating 40) can reduce shadowing effects which are caused by increasing a thickness of the grating membrane. For these reasons, it is desirable to reduce the thickness of the membrane of the grating as much as possible, whilst still providing sufficient absorption of the incident radiation and maintaining acceptable mechanical and thermal properties.

In addition, aluminium nitride (from which the absorbing layer 104 of the new grating 100 is formed) has a significantly higher thermal conductance than $Si_3N_4$ (by a factor of 10) and has a similar thermal conductance to that of chromium (from which the absorbing layer 42 and the support layer 43 respectively of the known grating 40 are formed). This is important because, in use, the absorbing layers 42, 104 of the grating will absorb a significant heat load, which should be dissipated (for example to a surrounding support frame) sufficiently efficiently so as to not result in excessive temperature differentials of thermal deformation of the grating.

Figure 8:
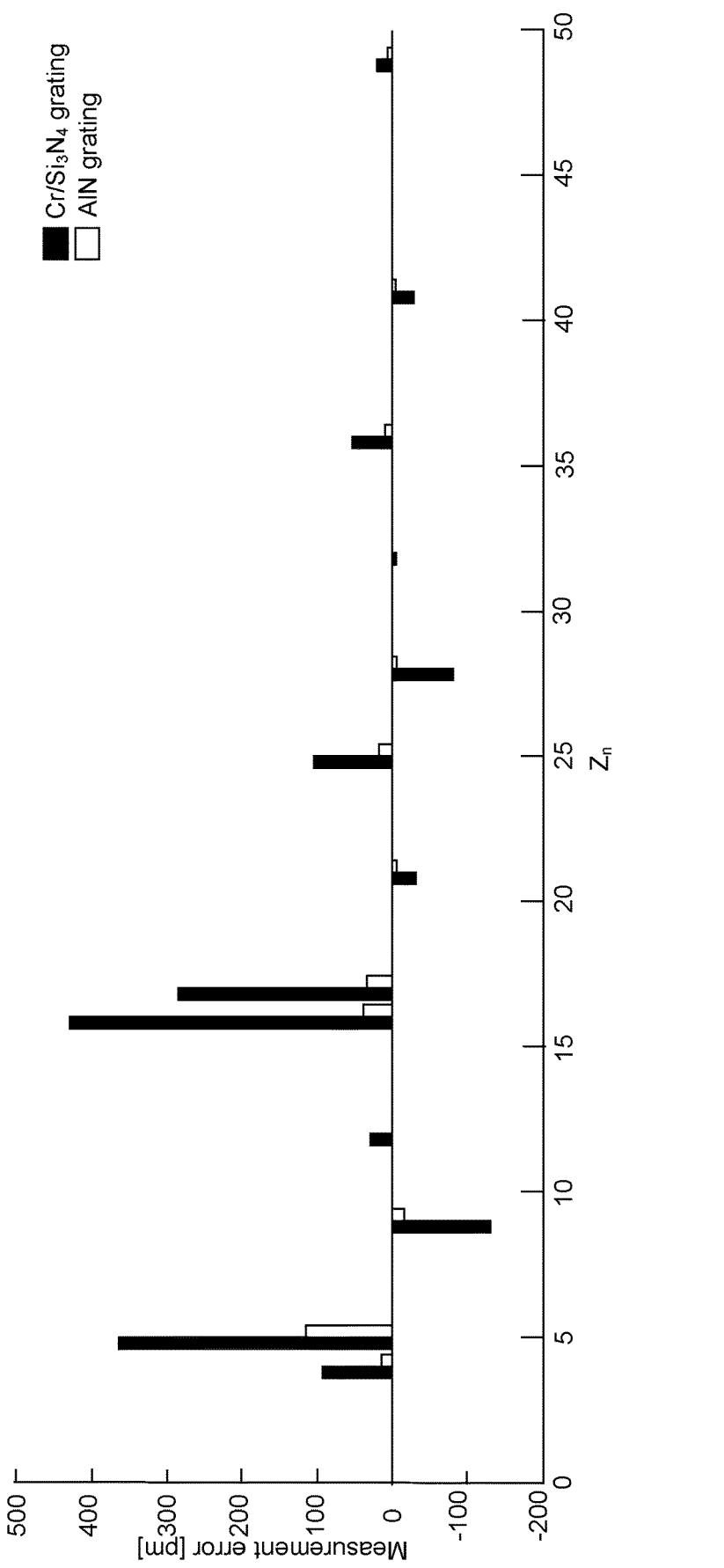
FIG. 8 shows a simulation of the estimated error (in picometers) due to three dimensional effects of the wafer level diffraction grating for the first 50 Zernike coefficients in a wavefront map measurement for both: (a) the known grating shown in FIG. 6 which has a layer of chromium and a layer of $Si_3N_4$; and (b) the new grating shown in FIG. 7 which has a layer of AlN.

In addition, the optical accuracy of the measurement system 10 that the two-dimensional grating will, in use, form part of (for example as a second patterned region 32) is increases, in particular for certain Zernike coefficients in a wavefront map measurement as now discussed with reference to FIG. 8. FIG. 8 shows a simulation of the estimated error (in picometers) due to three dimensional effects and the optical properties of the layer materials (such as refractive index and extinction coefficient) of the second patterned region 32 for the first 50 Zernike coefficients in a wavefront map measurement for both: (a) the known grating 40 shown in FIG. 6 which has a layer of chromium and a layer of $Si_3N_4$; and (b) the new grating shown in FIG. 7 which has a layer of AlN.

It can be clearly seen from FIG. 8 that the error on some of the Zernike in coefficients in a wavefront map measurement due to three dimensional effects is very large when using the known grating 40 shown in FIG. 6. In general, the Zernike coefficients which are affected by three dimensional effects and the optical properties of the layer materials (such as refractive index and extinction coefficient) include spherical Zernikes ($Z_9$, $Z_{16}$, $Z_{25}$ etc.) and 4-foil Zernikes (for example $Z_{17}$). The results shown in FIG. 8 were simulated with x-polarized light state, which, due to symmetry reasons, also results in astigmatism errors ($Z_5$, $Z_{12}$, $Z_{21}$, $Z_{32}$, etc.). In the case of unpolarized light state the Astigmatism errors will be zero. For example, the error for $Z_{16}$ is of the order of 420 μm. Furthermore, it can also be clearly seen from FIG. 8 that the errors on some the Zemike coefficients in a wavefront map measurement due to three dimensional and optical properties effects are significantly reduced when using the new grating 100 shown in FIG. 7. It is estimated that when using the new grating 100 shown in FIG. 7 the errors on some the Zemike coefficients in a wavefront map measurement due to three dimensional effects are reduced by a factor of around 10 (relative to when using the known grating 40 shown in FIG. 6).

It will be appreciated that the membrane of the diffraction grating 100 may have a range of different sizes. However, in some embodiments, the dimensions of the membrane of the diffraction grating may be such that the membrane of the grating may have a large aspect ratio (for example a ratio between dimensions of the membrane of the grating in a plane of the grating and the thickness of the membrane of the grating), as now discussed. This is particularly challenging for mechanical and thermal requirements. However, as set out below, it has been found that an absorbing layer 104 formed from aluminium nitride is able to meet these requirements.

Figure 9A:
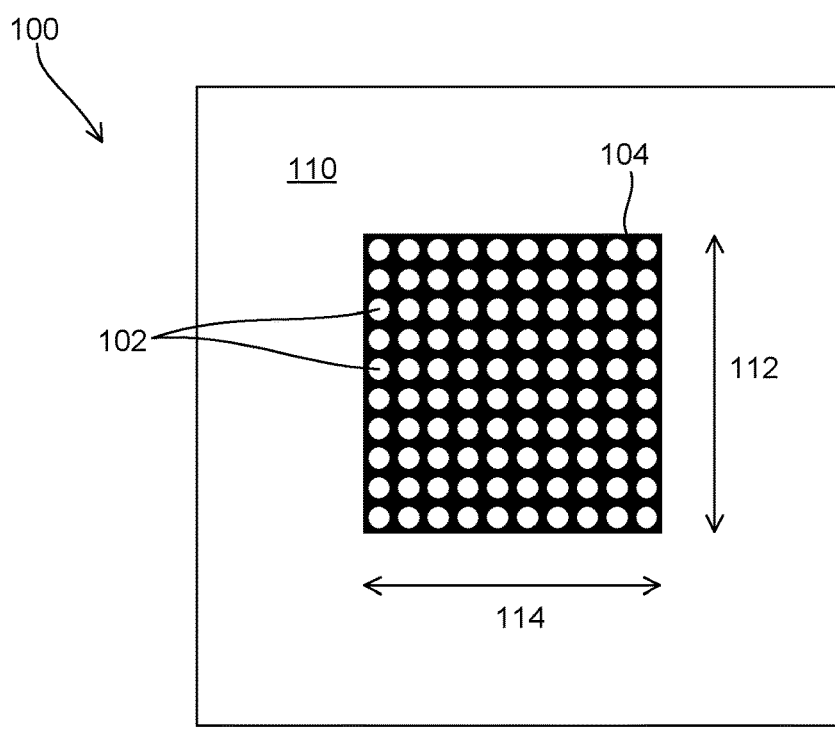
FIG. 9A shows in plan view the new diffraction grating shown in FIG. 7 in a plane of the absorbing layer (i.e. a plane perpendicular to the z direction in FIG. 7), the new grating further comprising a support for the absorbing layer.

FIG. 9A shows in plan (top) view the new diffraction grating 100 in a plane of the absorbing layer 104 (i.e. a plane perpendicular to the z direction in FIG. 7). In FIG. 9A it can be seen that, in some embodiments, the new grating 100 further comprises a support 110 for the absorbing layer 104. The support 110 generally surrounds the absorbing layer 104. Therefore the support 110 only contacts a peripheral portion of the absorbing layer 104.

The support 110 may be considered to be of the form of a frame. The support 110 may comprise a body that is significantly more rigid than the absorbing layer 104. For example the body may be significantly thicker (in a direction perpendicular to the plane of FIG. 9A) than the absorbing layer 104. It will be appreciated that the support 110 comprises an aperture (for example a generally square aperture) across which the absorbing layer 104 extends.

The support 110 does not comprise a support layer adjacent the absorbing layer 104. With such an arrangement, in a central portion of the absorbing layer 104, the absorbing layer 104 may be considered to be self-supporting. To achieve this, the absorbing layer 104 may be tensioned on the support 110 (for example such that it remains generally planar).

Advantageously, for such embodiments wherein the central portion of the absorbing layer 104 is self-supporting, the grating does not need, for example, a transmissive supporting layer (either patterned or otherwise). This is particularly beneficial for use in a phase-stepping measurement system for determining an aberration map for a projection system that uses EUV radiation since the use of a transmissive supporting layer could significantly reduce the amount of EUV radiation that is transmitted by the two-dimensional diffraction grating (if not patterned) and can contribute to three dimensional effects (if patterned).

Figure 9B:
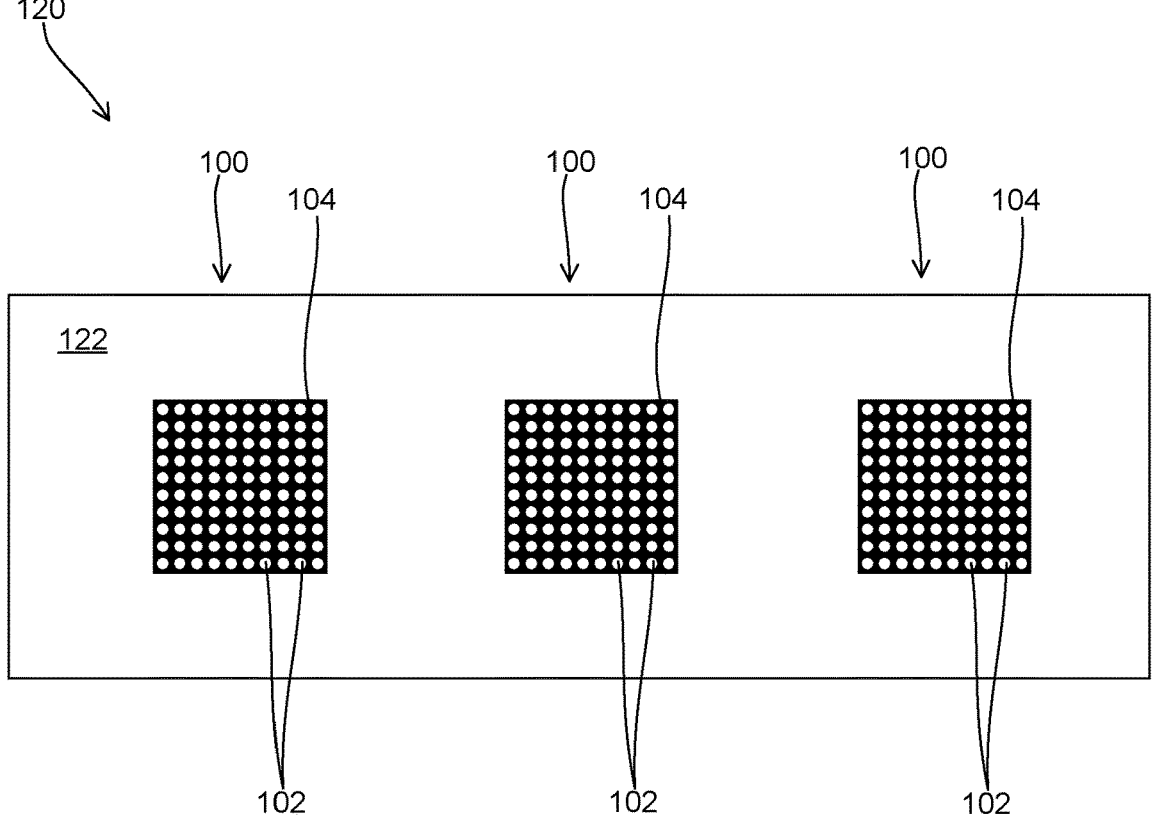
FIG. 9B shows in plan view a system comprising three of the new diffraction gratings shown in FIG. 7, shown in a plane of the absorbing layers, the system comprising a common support is for the three absorbing layers of the three new diffraction gratings.

FIG. 9B shows in plan view a system 120 comprising a plurality (in this example three) of the new diffraction gratings 100, shown in a plane of the absorbing layers 104 (i.e. a plane perpendicular to the z direction in FIG. 7). In the system 120 shown in FIG. 9B, a common support 122 is provided for the three absorbing layers 104 of the three new diffraction gratings 100. The common support 122 generally surrounds each of the absorbing layers 104. Therefore the common support 122 only contacts a peripheral portion of the absorbing layer 104.

The common support 122 may be considered to be of the form of a frame. The common support 122 may comprise a body that is significantly more rigid than the absorbing layer 104. For example the body may be significantly thicker (in a direction perpendicular to the plane of FIG. 9B) than the absorbing layer 104. It will be appreciated that the common support 122 comprises a plurality of apertures (for example three generally square apertures) across which a different one of the absorbing layers 104 extends.

Note that the new diffraction grating shown in FIG. 9A and/or the system 120 shown in FIG. 9B may be used as part of the sensor apparatus 21 described above with reference to FIGS. 2 to 5C.

The embodiment of grating shown in FIG. 7 and described above has an absorbing layer 104 with a thickness of 100 nm. In other embodiments, it may be desirable for the membrane of the grating to have a thickness of less than 150 nm. Advantageously, this can reduce shadowing effects which are caused by increasing a thickness of the grating and phase retardation effects (which scale with the thickness of the membrane multiplied by the difference in refractive index between the membrane material and the surrounding medium). For these reasons, it is desirable to reduce the thickness of the absorbing layer as much as possible, whilst still providing sufficient absorption of the incident radiation and maintaining acceptable mechanical and thermal properties.

The dimensions 112, 114 of the membrane of the grating 100 in a plane of the grating 100 (see FIG. 9A) may, in general, be 10 μm or greater. For example, in some embodiments the dimensions 112, 114 of the membrane of the grating in the plane of the grating may be 25 μm×25 μm. Alternatively, in some embodiments the dimensions 112, 114 of the membrane of the grating in the plane of the grating may, for example, be 50 μm×50 μm. Alternatively, in some embodiments the dimensions 112, 114 of the membrane of the grating in the plane of the grating may, for example, be 140 μm×140 μm.

For an embodiment wherein the dimensions 112, 114 of the membrane of the grating in a plane of the grating are 10 μm or greater and the membrane of the grating has a thickness of less than 150 nm, an aspect ratio of the membrane of the grating (for example a ratio between dimensions of the membrane of the grating in a plane of the grating and the thickness of the membrane of the grating) may be of the order of 100 or greater.

In general, provided the absorbing layer is of sufficient thickness to provide adequate absorption of the EUV radiation, a smaller the thickness of the membrane is beneficial for the optical performance of the grating (for example reducing three dimensional effects) but may be challenging to achieve whilst maintaining acceptable mechanical and thermal properties. It may be desirable to reduce an aspect ratio between the thickness of the membrane and a pitch of the pattern (i.e. the size of a unit cell of the pattern) in order to reduce three-dimensional effects. In order to maintain acceptable mechanical and thermal properties for these embodiments, the grating membrane may comprise a support layer adjacent to the absorbing layer.

The absorbing layer 104 of the new grating 100 may be tensioned on the support 110, 122 with a pretension of at least 50 MPa. A typical pretension may be in the range 25 MPa to a few hundred MPa, for example in the range 50 MPa to 100 MPa.

In general, a sufficient amount of pretension should be applied to the absorbing layer 104 of the new grating 100 such that it does not sag and remains substantially flat. Furthermore, the amount of pretension should be selected such that the absorbing layer remains substantially flat during use. In use, the absorbing layer will absorb EUV radiation, which will cause the absorbing layer to increase in temperature and to expand. This will tend to reduce the amount of tension in the absorbing layer 104, which could cause the absorbing layer to sag. The amount of pretension should be selected such that even during use when the absorbing layer 104 is subject to this heat load the absorbing layer 104 retains sufficient tension.

In order to achieve such an arrangement, the material from which the absorbing layer 104 is formed should have sufficient strength. It will be appreciated that the tension applied to the absorbing layer 104 will be concentrated around the edges of the through-apertures 102 in the absorbing layer 104. For example, for circular apertures 102 the tension around the edges of the through-apertures 102 in the absorbing layer 104 may be factor of 2.7 greater than the tension applied to the absorbing layer 104 by the support 110, 122. For other shaped apertures 102 (for example square apertures) the tension around the edges of the through-apertures 102 in the absorbing layer 104 will be greater than the tension applied to the absorbing layer 104 by the support 110, 122 by an even larger factor (particularly at the corners of the square apertures 102).

Therefore, in order to be sufficiently strong to withstand a pretension of at least 50 MPa, the material from which the absorbing layer is formed may have a tensile strength that is several times larger than this. The tensile strength (also referred to as fracture strength) of aluminium nitride is of the order of 1.42-1.54 GPa and therefore the absorbing layer 104 of the new grating is sufficiently strong to withstand this pretension.

Generally, it may be desirable for the material from which the absorbing layer 104 is formed to have a tensile strength of at least 500 MPa.

In addition to a high tensile strength, the material from which the absorbing layer 104 is formed may also have the following mechanical and thermal properties.

The material from which the absorbing layer 104 is formed may be relatively stiff. For example, the material from which the absorbing layer 104 is formed may have a sufficiently high Young's modulus such that stress within the absorbing layer 104 does not cause significant distortion of the grating pattern. This stress may include pre-tension applied during manufacture of the grating and stress caused by thermal expansion in use due to the heat load from the incident radiation.

Aluminium nitride has a Young's modulus of the order of 305±10 GPa and therefore the absorbing layer 104 of the new grating is sufficiently stiff to be suitable for use in the new grating 100.

In general, the material from which the absorbing layer is formed may have a Young's modulus of at least 70 GPa. It may be preferred for the material from which the absorbing layer is formed may have a Young's modulus of at least 100 GPa. It may be preferred for the material from which the absorbing layer is formed may have a Young's modulus of at least 200 GPa.

The material from which the absorbing layer 104 is formed may have a relatively small coefficient of thermal expansion. This will reduce distortion and internal stress within the absorbing layer. For example, the material from which the absorbing layer is formed may have a coefficient of thermal expansion of less than $10^{-5}K^{-1}$. Aluminium nitride has a coefficient of thermal expansion of less than $5.3 \times 10^{-6}K^{-1}$.

The material from which the absorbing layer 104 is formed may have a relatively large thermal conductivity. This will help dissipate the heat load (for example to the surrounding support 110, 122). For example, the material from which the absorbing layer 104 is formed may have a thermal conductivity of at least 40 W/mK. Aluminium nitride has a thermal conductivity of around 50-78 W/mK.

In particular, the material from which the absorbing layer 104 is formed should selected such that it has the following mechanical and thermal properties.

In use, the absorbing layer 104 will absorb EUV radiation, which will cause the absorbing layer to increase in temperature and to expand. For example, the absorbing layer may be subject to a heat load of the order of 1300 W/m². Assuming that the through apertures are circular, the dimensions of the absorbing layer are 100 nm×140 μm×140 μm and that the temperature of the support 110, 122 remains constant, the change in temperature of the absorbing layer 104 is estimated to be <1K. As a result, there will be only a very small loss in pretension of the absorbing layer 104. Therefore, it is estimated that a pre-tension of the order of 100 MPa will be sufficient for the absorbing layer 104. This will result in stress of the order of 270 MPa around the apertures 102 (this assumes a stress concentration factor of 2.7, which is typical for a pinhole array). Since the tensile strength of aluminium nitride is of the order of 1.42-1.54 GPa (1420-1540 MPa) there is a safety factor of the order of 5 (the ratio of the tensile strength to the maximum stress within the absorbing layer 104). During transport (for example from a point of manufacture to a lithographic apparatus) some additional stress may be experienced due to the different coefficients of thermal expansion between the absorbing layer 104 and the support 110, 122 (which may, for example be formed in silicon). Assuming a temperature range of 42° C. during transport, it is estimated that the maximum stress in the absorbing layer 104 may be of the order of 400 MPa. This still allows a safety factor of 3.5 relative to the tensile strength of aluminium nitride.

The following estimates use the thermal and mechanical properties of aluminium nitride as listed in the following table:

| Parameter | AlN (thin film 100 nm) |
|---|---|
| Young's modulus [GPa] | 305 ± 10 |
| Poisson's ratio | 0.287 |
| CTE [1/K] | 5.3 · 10-6 |
| Thermal conductivity [W/m K] | 50-78 |
| Density [g/cm3] | 3.26 |
| Fracture strength [GPa] | 1.42-1.54 |

In some embodiments, the absorbing layer may be provided with a protective layer, as now discussed with reference to FIG. 10.

Figure 10:
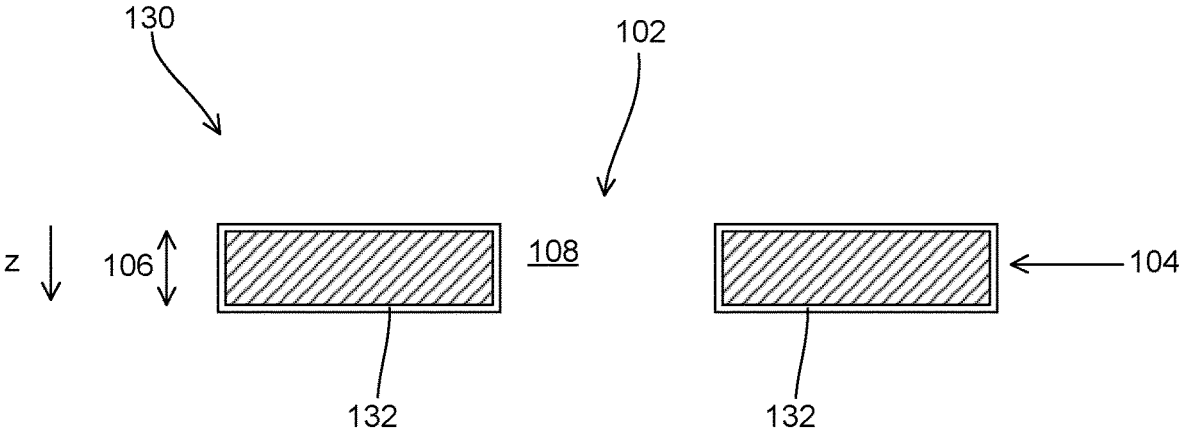
FIG. 10 shows a cross section of a portion of a membrane forming a new two-dimensional diffraction grating through one of the apertures of the grating, the grating comprising a single absorbing layer and a protective coating.

FIG. 10 shows a new two-dimensional diffraction grating 130 which shares many features in common with the two-dimensional diffraction grating 100 shown in FIG. 7. Features of the new diffraction grating 130 shown in FIG. 10 which are equivalent to features of the new diffraction grating 100 shown in FIG. 7 share common reference numerals. Only the difference between the new diffraction grating 130 shown in FIG. 10 and the new diffraction grating 100 shown in FIG. 7 is described here. In all other aspects, the new diffraction grating 130 shown in FIG. 10 is the same as the new diffraction grating 100 shown in FIG. 7. The new diffraction grating 130 shown in FIG. 10 may be supported by a support 110 of the type shown in FIG. 9A. Alternatively, the new diffraction grating 130 may form part of a system 120 of the type shown in FIG. 9B comprising a plurality of the new diffraction gratings 130 and a common support 122.

FIG. 10 shows a cross section of a portion of a membrane forming the new two-dimensional diffraction grating 130 through one of the apertures 102 of the grating 100.

The absorbing layer 104 is provided with a protective coating 132. The protective coating 132 may have a thickness of a few nm. For example, the protective coating 132 may have a thickness of the order of 5-10 nm.

The protective coating 132 is formed from a material having suitable chemical properties so as to be stable in the environment of an EUV lithographic apparatus LA. In particular, the protective coating 132 may be formed from any material that is more suitable for use in such an environment so as to enhance the lifetime performance of the absorbing layer 104.

It may also be desirable for the material from which the protective coating 132 is formed to have a relatively high extinction coefficient for EUV radiation (to enhance the absorption of the EUV radiation and a refractive index which is as close as possible to 1 (to reduce phase retardation effects).

Suitable materials for the protective coating 132 include aluminium oxide ($Al_2O_3$), chromium and ruthenium. Aluminium oxide ($Al_2O_3$) has an extinction coefficient for EUV radiation of 0.039 and a refractive index for EUV radiation of 0.968. Chromium has an extinction coefficient for EUV radiation of 0.039 and a refractive index for EUV radiation of 0.932. Ruthenium has an extinction coefficient for EUV radiation of 0.017 and a refractive index for EUV radiation of 0.886. Based on these properties, it may be preferred for the protective coating to comprise $Al_2O_3$. Suitable materials for the protective coating 132 include chromium (Cr). The protective layer may be applied to the top, bottom and side walls of the grating 100 or the membrane of the grating 100 or the absorbing layer 104.

For embodiments wherein the absorbing layer 104 is provided with a protective coating 132, an effective refractive index of the absorbing layer 104 and protective coating 132 of the two-dimensional grating may have a refractive index which is close to 1. For example, the absorbing layer 104 and the protective coating 132 may be formed material which have an effective refractive index which is close to 1 for the radiation having the first wavelength (i.e. in the range 0.96 to 1.04 such that $|n-1| \leq 0.04$).

Here, it will be appreciated that the effective refractive index of a composite material may be defined as the refractive index the ratio of the speed of light in vacuum to the average speed of light in the composite material. It will be appreciated that this is a weighted average of the refractive indices of the component materials, wherein the average is weighted by the thicknesses of the materials. For example, consider an embodiment comprising an absorbing layer with a thickness of 100 nm and a refractive index of 0.98 that is provided with a 10 nm coating of a material having a refractive index of 0.97. As (normally incident) light propagates through this composite system, it will travel through 20 nm of the coating material and 100 nm of the absorbing material. It will therefore experience an effective refractive index of $(100*0.98+20*0.97)/120=0.978$.

At least a portion of the incident radiation will only propagate through the protective coating 132 (if incident proximate to one of the apertures 102 of the grating 130 at a suitable angle of incidence). Therefore, it may be preferred for the refractive index of both the absorbing layer 104 and the protective coating 132 to have a refractive index which is close to 1. For example, the absorbing layer 104 and the protective coating 132 may both be formed materials which have an effective refractive index which is close to 1 for the radiation having the first wavelength (i.e. in the range 0.96 to 1.04 such that $|n-1| \leq 0.04$).

According to some embodiments of the invention there may be provided a method of designing a diffraction grating for a phase-stepping measurement system for determining an aberration map for a projection system. The method may comprise selecting a material for an absorbing layer of the grating which is provided with a two-dimensional array of apertures. For example, the method may comprise selecting a material such that the refractive index of the material for the radiation having a first wavelength (for example EUV radiation) is substantially matched to a (transmissive) medium disposed within the apertures. For example, the method may comprise selecting a material such that the refractive index of the material for the radiation having a first wavelength (for example EUV radiation) is in the range 0.% to 1.04.

It will be appreciated that the methods for designing a diffraction grating for a phase-stepping measurement system for determining an aberration map for a projection system may take into account any of the above-mentioned considerations and teachings.

The method may take into account a ratio of a dimension of the membrane of the grating in a plane of the grating to a thickness of the membrane of the absorbing layer.

The method may take into account properties of a frame type support for the membrane.

The method may take into account an amount of pretension applied to the membrane when it is mounted to a frame type support during manufacture.

The method may take into account one or more mechanical properties of the membrane including any of the following: tensile strength, Young's modulus, Poisson's ratio and/or density.

The method may take into account one or more thermal properties of the membrane including any of the following: coefficient of thermal expansion; and/or thermal conductivity.

Figure 11:
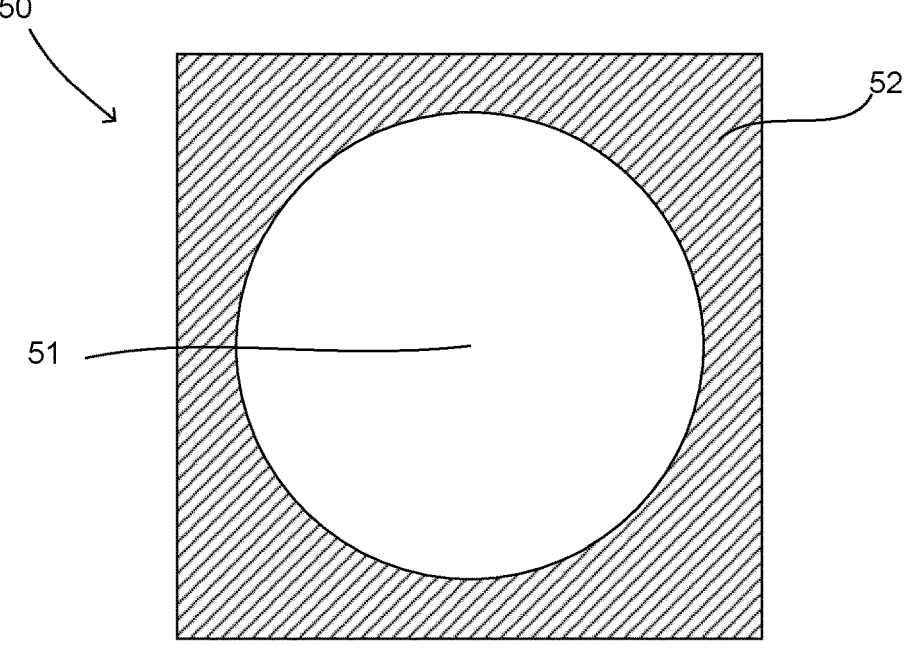
FIG. 11 shows a unit cell of a first example of a two-dimensional grating geometry comprising an array of circular pinholes.

It will be appreciated that a square array of apertures comprises a plurality of rows of apertures arranged such that the centres of the apertures form a square grid. It will be appreciated that the apertures may have various different shapes. The through-apertures may have any desired shape although it will be appreciated that for embodiments wherein the substrate provided with the square array of through-apertures is not supported by a support layer, at least some substrate material may be provided between each through-aperture and its adjacent through apertures. Various different geometries that may be used are shown in FIGS. 11 to 13.

A first possible geometry for a diffraction grating according to an embodiment of the present invention (which may, for example, form a second patterned device 32) comprises an array of circular pinholes. FIG. 11 shows the unit cell 50 of such a grating. The unit cell 50 comprises a circular aperture 51 provided in an EUV absorbing membrane 52. The circular aperture 51 is a through aperture which represents a void in the EUV absorbing membrane 52 through which EUV radiation is transmitted. The duty cycle of such a grating geometry may be characterized by a ratio of the radius of the circular apertures to the distance between the centres of adjacent apertures. The unit cell 50 shown in FIG. 11 has a duty cycle (by area) of approximately 50% although it will be appreciated that the size of the pinholes may be different so as to produce a different duty cycle.

Figure 12:
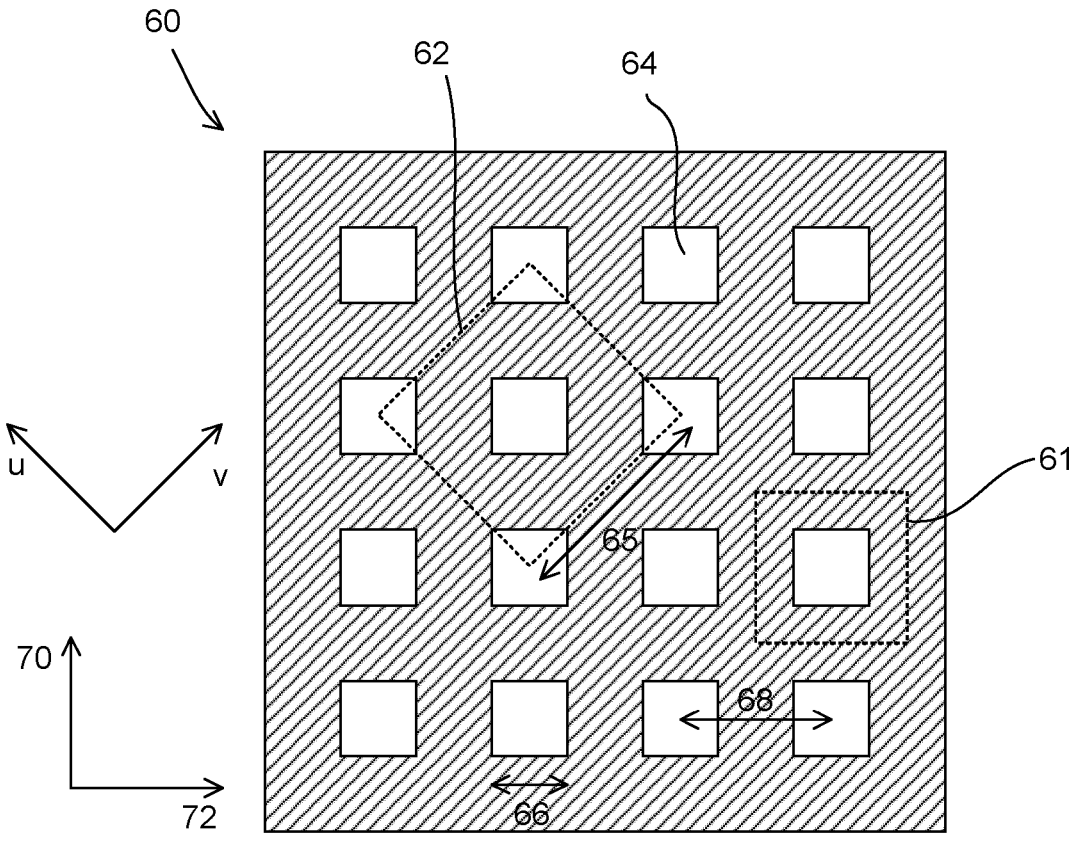
FIG. 12 shows a portion of a second example of a two-dimensional grating geometry comprising an array of square apertures.
Figure 13:
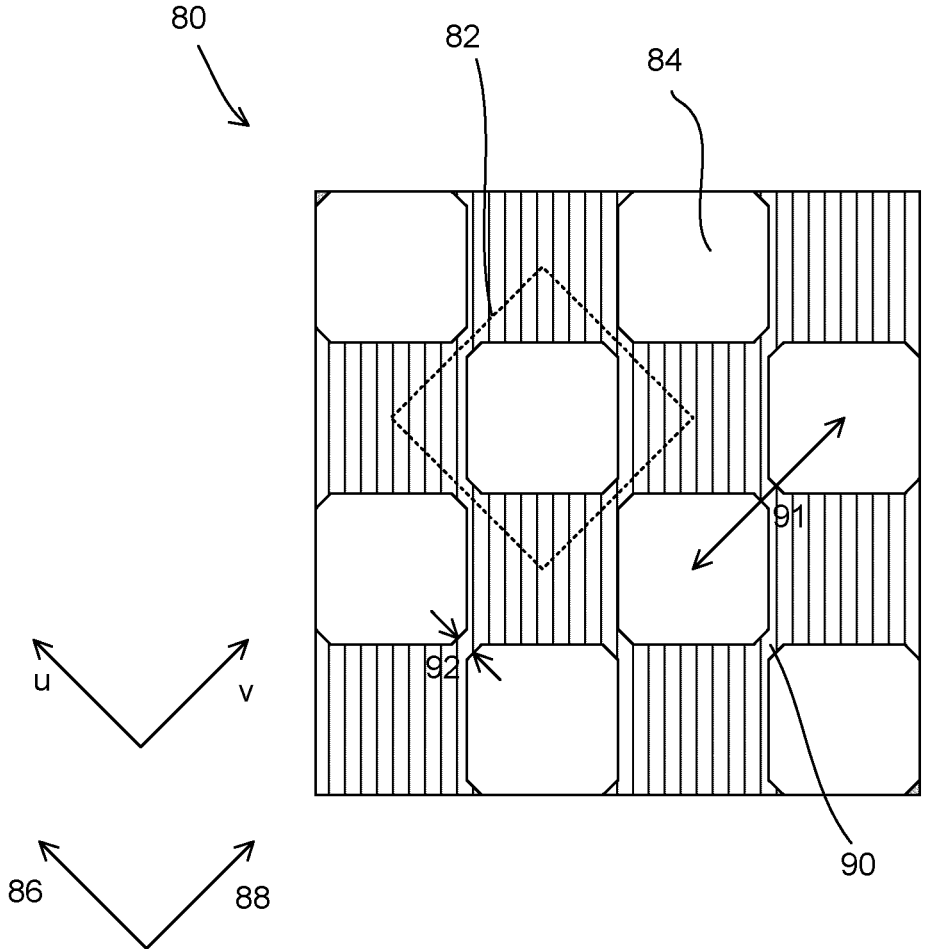
FIG. 13 shows a portion of a third example of a two-dimensional grating geometry comprising an array of octagonal apertures.

A second possible geometry for a diffraction grating according to an embodiment of the present invention (which may, for example, form a second patterned device 32) is shown in FIG. 12. FIG. 12 shows a portion of a grating 60, which has a geometry which may be referred to as a Gingham geometry or pattern. The unit cell 61 of the grating 60 is also indicated in FIG. 12 by a dotted line. It will be appreciated that the grating 60 may have fewer or more repetitions of the unit cell 61 than are shown in FIG. 12.

The two-dimensional diffraction grating 60 comprises a square array of square apertures 64. Each of the square apertures 64 has a length 66 that is half the distance 68 between the centres of adjacent apertures 64. Here it will be understood that adjacent apertures are intended to mean those displaced by one position in the square array in a direction parallel to one of the axes 70, 72 of the square array formed by the square apertures 64. Note that the sides of the square apertures 64 are parallel to the axes 70, 72 of the square array formed by the square apertures 64. The unit cell 61 has a length (which defines a pitch of the grating) which is equal to the distance 68 between the centres of adjacent apertures 64.

The sides of the square unit cell 61 are parallel to the axes 70, 72 of the square array formed by the square apertures 64. The diffraction beams formed by the grating 60 therefore form a square array of second diffraction beams, the axes of which are parallel to the axes 70, 72 of the square array formed by the square apertures 64. In use, the self-supporting grating 60 may form the second patterned region 32 and axes indicating the u-direction and v-direction (which may represent the shearing and non-shearing directions defined by the first patterned region 31) for such embodiments are also indicated in FIG. 12 and are disposed at 45° to the sides of the unit cell 61.

Unit cell 61 is the smallest non-repeating section from which the repeating pattern of two-dimensional diffraction grating 60 is formed. The fundamental pitch 68 of such the two-dimensional diffraction grating 60 is the length of the square unit cell 61.

In use, grating 60 is suitable for use with a first patterned region 31 with the shearing and non-shearing directions (indicated by the u and v axes in FIG. 12) defined by said first patterned region 31 being disposed at 45° to the unit cell 61. For such an arrangement wherein the axes of the unit cell 61 of the two-dimensional grating 60 are arranged at 45° to the shearing and non-shearing directions, it is useful to define a pseudo-unit cell 62 and a pseudo-pitch 65 as follows. The pseudo-unit cell 62 is defined as the smallest non-repeating square from which the repeating pattern of the diffraction grating 60 is formed, which is orientated such that its sides are parallel to the shearing and non-shearing directions as defined by the first patterned region 31 (indicated by the u and v axes in FIG. 12). The pseudo-pitch 65 is defined as a length of the square pseudo-unit cell 62. This may be referred to as the pitch of a two dimensional diffraction grating 60 in the shearing direction. It is this pseudo-pitch 62 which should be matched to (an integer multiple or fraction of) the pitch of the first patterned region 31.

A third possible geometry for a diffraction grating according to an embodiment of the present invention (which may, for example, form a second patterned device 32) is shown in FIG. 13. FIG. 13 shows a portion of a grating 80. The unit cell 82 of self-supporting grating 80 is also indicated in FIG. 13 by a dotted line. It will be appreciated that self-supporting grating 80 may have fewer or more repetitions of the unit cell 82 than are shown in FIG. 13.

The two-dimensional diffraction grating 80 comprises a square array of through-apertures 84 which are generally octagonal. Generally octagonal through-apertures 84 are formed from a square that is orientated at 45° to the axes 86, 88 of the square array of through-apertures 84 and having a diagonal dimension that matches a distance 91 between the centres of adjacent through-apertures, each of the four corners of the square having been truncated so as to form a generally rectangular connecting portion 90 of the substrate between each pair of adjacent through apertures 84.

This grating 80 provides an arrangement that is similar to a checkerboard grating but wherein connecting portions 90 or side-bars are provided to ensure that the grating 80 is self-supporting.

It will be appreciated that the dimensions of such connecting portions 90 that are provided so as to ensure that the grating 80 is self-supporting may be dependent on the thickness of the substrate. In some embodiments, a width 92 of the generally rectangular connecting portions 90 is approximately 10% of the distance between the centres of adjacent through-apertures 84. For example, the width of the generally rectangular connecting portions 90 of the substrate between each pair of adjacent through apertures may be between 5% and 15% of the distance between the centres of adjacent through-apertures 84, for example, between 8% and 12% of the distance between the centres of adjacent through-apertures 84.

The self-supporting grating 80 may form the second patterned region 32 and axes indicating the u-direction and v-direction for such embodiments are also indicated in FIG. 13.

Although the above described embodiments use the first harmonic of the a phase stepping signal it will be appreciated that in alternative embodiments higher harmonics of the phase stepping signal may alternatively be used.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A transmissive diffraction grating for a phase-stepping measurement system for determining an aberration map for a projection system using radiation having a first wavelength, wherein the transmissive diffraction grating comprises:

an absorbing layer provided with a two-dimensional array of through-apertures, wherein the absorbing layer is formed from a material that has a first refractive index for the radiation having the first wavelength, wherein a transmissive medium in the through-apertures has a second refractive index for the radiation having the first wavelength, and wherein an absolute value of the difference between the first refractive index and the second refractive index is less than or equal to 0.04.

2. The transmissive diffraction grating of claim 1, wherein the absorbing layer comprises aluminum.

3. The transmissive diffraction grating of claim 1, wherein the absorbing layer comprises a ceramic.

4. The transmissive diffraction grating of claim 1, wherein the absorbing layer comprises aluminum nitride (AlN).

5. The transmissive diffraction grating of claim 1, wherein a membrane of the grating has a thickness of less than 150 nm.

6. The transmissive diffraction grating of claim 1, wherein the dimensions of a membrane of the grating in a plane of the grating are 10 μm or greater.

7. The transmissive diffraction grating of claim 1, wherein a ratio of a dimension of a membrane of the grating in a plane of the grating to a thickness of the absorbing layer is of the order of 100 or greater.

8. The transmissive diffraction grating of claim 1, further comprising a support for the absorbing layer, wherein the support only contacts a peripheral portion of the absorbing layer.

9. The transmissive diffraction grating of claim 1, wherein the material from which the absorbing layer is formed has a tensile strength of at least 500 MPa or/and a Young's modulus of at least 70 GPa.

10. The transmissive diffraction grating of claim 1, wherein the absorbing layer is provided with a protective coating.

11. The transmissive diffraction grating of claim 10, wherein the protective coating comprises aluminum oxide ($Al_2O_3$) or/and chromium (Cr).

12. A transmissive diffraction grating for a phase-stepping measurement system for determining an aberration map for a projection system using radiation having a first wavelength, wherein the transmissive diffraction grating comprises:

a two-dimensional array of through-apertures provided within an absorbing layer, wherein the absorbing layer comprises aluminum, and wherein a transmissive medium within the array of through apertures has a refractive index of about 1.

13. A measurement system for determining an aberration map for a projection system, the measurement system comprising:

an illumination system;

a patterning device comprising a first patterned region comprising a first diffraction grating arranged to receive a radiation beam from the illumination system and to form a plurality of first diffraction beams, the first diffraction beams being separated in a shearing direction;

a sensor apparatus comprising a second patterned region, the second patterned region comprising:

a second diffraction grating for a phase-stepping measurement system for determining an aberration map for a projection system using radiation having a first wavelength, wherein the second diffraction grating comprises an absorbing layer provided with a two-dimensional array of through-apertures, the absorbing layer being formed from a material that has a refractive index for the radiation having the first wavelength in the range of about 0.96 to about 1.04, and a radiation detector;

wherein the projection system is configured to project the first diffraction beams onto the sensor apparatus, wherein the second patterned region is arranged to receive the first diffraction beams from the projection system and to form a plurality of second diffraction beams from each of the first diffraction beams;

a positioning apparatus configured to move at least one of the patterning device and the sensor apparatus in the shearing direction; and a controller configured to:

control the positioning apparatus so as to move at least one of the first patterning devices and the sensor apparatus in the shearing direction such that an intensity of radiation received by each part of the radiation detector varies as a function of the movement in the shearing direction so as to form an oscillating signal;

determine from the radiation detector a phase of a harmonic of the oscillating signal at a plurality of positions on the radiation detector; and determine a set of coefficients that characterize the aberration map of the projection system from the phase of a harmonic of the oscillating signal at the plurality of positions on the radiation detector.

14. A lithographic apparatus comprising:

a projection system;

a measurement system configured to determine an aberration map for the projection system, the measurement system comprising:

an illumination system;

a patterning device comprising a first patterned region comprising a first diffraction grating arranged to receive a radiation beam from the illumination system and to form a plurality of first diffraction beams, the first diffraction beams being separated in a shearing direction;

a sensor apparatus comprising a second patterned region, the second patterned region comprising a second diffraction grating for a phase-stepping measurement system for determining an aberration map for a projection system using radiation having a first wavelength, wherein the second diffraction grating comprises:

an absorbing layer provided with a two-dimensional array of through-apertures, wherein the absorbing layer is formed from a material that has a refractive index for the radiation having the first wavelength in the range of about 0.96 to about 1.04, and a radiation detector;

wherein the projection system is configured to project the first diffraction beams onto the sensor apparatus, wherein the second patterned region is arranged to receive the first diffraction beams from the projection system and to form a plurality of second diffraction beams from each of the first diffraction beams; and a positioning apparatus configured to move at least one of the patterning devices and the sensor apparatus in the shearing direction; and a controller configured to:

control the positioning apparatus so as to move at least one of the first patterning device and the sensor apparatus in the shearing direction such that an intensity of radiation received by each part of the radiation detector varies as a function of the movement in the shearing direction so as to form an oscillating signal;

determine from the radiation detector a phase of a harmonic of the oscillating signal at a plurality of positions on the radiation detector; and determine a set of coefficients that characterize the aberration map of the projection system from the phase of a harmonic of the oscillating signal at the plurality of positions on the radiation detector.

\*　\*　\*　\*　\*